(12) United States Patent
Suwada et al.

(10) Patent No.: US 6,925,430 B2
(45) Date of Patent: Aug. 2, 2005

(54) METHOD OF AND APPARATUS FOR SIGNAL-WAVEFORM SIMULATION, AND COMPUTER PRODUCT

(75) Inventors: Makoto Suwada, Kawasaki (JP); Tatsuo Koizumi, Kawasaki (JP); Masaki Tosaka, Kawasaki (JP); Kazuhiko Tokuda, Kawasaki (JP); Jiro Yoneda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 669 days.

(21) Appl. No.: 09/945,696

(22) Filed: Sep. 5, 2001

(65) Prior Publication Data

US 2002/0032555 A1 Mar. 14, 2002

(30) Foreign Application Priority Data

Sep. 8, 2000 (JP) .................................... 2000-273267
Aug. 21, 2001 (JP) .................................... 2001-250102

(51) Int. Cl.$^7$ ............................................. G06F 17/50
(52) U.S. Cl. ............................. 703/15; 702/67; 702/69; 714/738; 714/739; 714/741; 716/4; 716/5; 716/6
(58) Field of Search .............................. 703/2, 13, 14, 703/15, 19, 20; 702/66, 67, 69, 70, 71, 73, 179, 189; 714/714, 736, 738, 726, 700, 739, 741; 716/4, 5, 6, 15, 16

(56) References Cited

U.S. PATENT DOCUMENTS 4,777,616 A * 10/1988 Moore et al. ................. 703/15
4,908,576 A * 3/1990 Jackson ....................... 714/726
5,361,277 A * 11/1994 Grover ......................... 375/356
5,394,106 A * 2/1995 Black et al. .................. 327/107
5,701,441 A * 12/1997 Trimberger ................... 716/16
5,838,954 A * 11/1998 Trimberger ................... 716/16
6,006,350 A * 12/1999 Tsujii .......................... 714/738
6,185,509 B1 * 2/2001 Wilstrup et al. ............... 702/69
6,449,570 B1 * 9/2002 Wilstrup et al. ............... 702/69

FOREIGN PATENT DOCUMENTS

JP          11-274307          10/1999

OTHER PUBLICATIONS

Tamura et al., Path Delay Analysis for Hierarchical Building Block Layout System, IEEE 1983.*
Forno et al., Advanced Simulaiton and Modeling Techniques for Hardware Verification of Digital Systems, ACM 1994.*
Dally et al., Transmitter Equalization for 4–Gbps Signaling, IEEE Micro 1997.*
Cuviello et al., Fault Modeling and Simulation for Crosstalk in System–on–Chip Interconnects, IEEE 1999.*

* cited by examiner

Primary Examiner—William Thomson
(74) Attorney, Agent, or Firm—Staas & Halsey

(57) ABSTRACT

The apparatus includes the wiring-model generation section that generates a wiring model in accordance with high-frequency-circuit design information; the random-pattern analysis section that generates and analyzes a dummy random-pattern waveform for transmitting a wiring model in accordance with a command including the bit information of a random-pattern waveform and a differential waveform corresponding to the dummy random-pattern waveform; and the skew analysis section that skews a random-pattern waveform or differential waveform in accordance with a preset skew width.

10 Claims, 22 Drawing Sheets

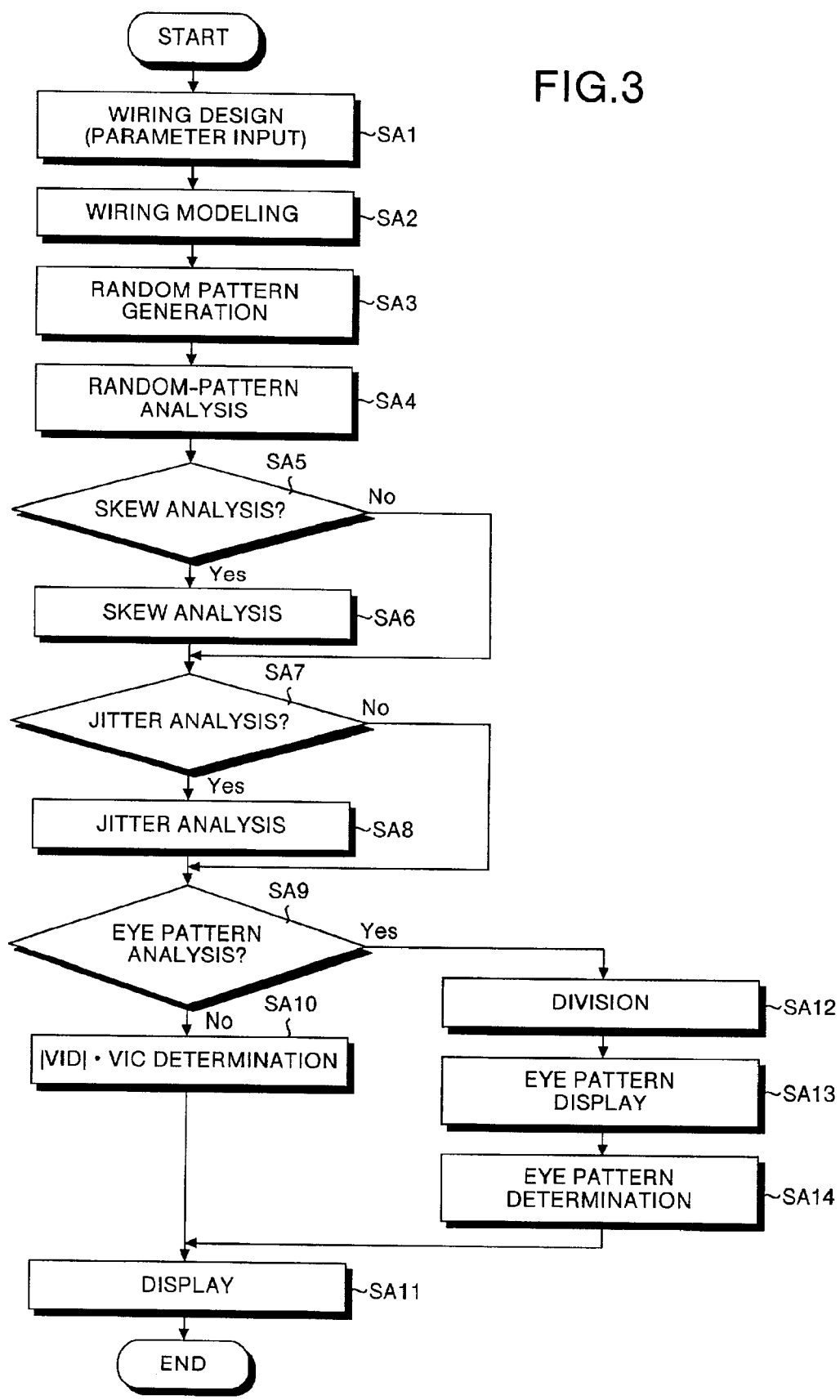

```
60
EYEBIT      [Input Bit Pattern]
BITWIDTH    [Bit • Width]
EYEEVENT    [Eye Pattern Event]
```

```
61
PRBS2⁷-1   0000000111 1110111110 0111101011 1000011011 1010011000
           1010110000 0101111000 1110110110 0100101001 0000100111
           0010110100 0100011001 1010101
K28.5      1100000101
K28.7      1100000111
```

```
62
EYEBIT      1011011100
BITWIDTH    1000
EYEEVENT    500
```

Neg_Wave ——— 70

Pos_Wave ——— 71

|←— Skew_MAX:100ps

• Pos_Wave(DELAYED BY 100ps)

```
PWL                    1.1ns    0v
+      1.11ns   3.3v   2.09ns   3.3v
+      2.1ns    0v     3.08ns   0v
+      3.09ns   3.3v   7.99ns   3.3v
+      8.00ns   0v     8.98ns   0v
+      8.99ns   3.3v   ........................
+      ........................................
```

• Neg_Wave

```
PWL                    1ns      3.3v
+      1.01ns   0v     1.99ns   0v
+      2ns      3.3v   2.98ns   3.3v
+      2.99ns   0v     7.89ns   0v
+      7.90ns   3.3v   8.88ns   3.3v
+      8.89ns   0v     ........................
+      ........................................
```

Neg_Wave — 70
Pos_Wave — 71
Skew_MAX:100ps

· Pos_Wave

| PWL | | | 1ns | 0v |
|---|---|---|---|---|
| + | 1.01ns | 3.3v | 1.99ns | 3.3v |
| + | 2ns | 0v | 2.98ns | 0v |
| + | 2.99ns | 3.3v | 7.89ns | 3.3v |
| + | 7.90ns | 0v | 8.88ns | 0v |
| + | 8.89ns | 3.3v | ............ | |
| + | ............ | | | |

· Neg_Wave(DELAYED BY 100ps)

| PWL | | | 1.1ns | 3.3v |
|---|---|---|---|---|
| + | 1.11ns | 0v | 2.09ns | 0v |
| + | 2.1ns | 3.3v | 3.08ns | 3.3v |
| + | 3.09ns | 0v | 7.99ns | 0v |
| + | 8.00ns | 3.3v | 8.98ns | 3.3v |
| + | 8.99ns | 0v | ............ | |
| + | ............ | | | |

FIG.9A
JITTER ADDITION COMMAND : ADDJITTER [Jitter_Value]  80
FIG.9B
DESIGNATION EXAMPLE  81
ADDJITTER  250
FIG.10A
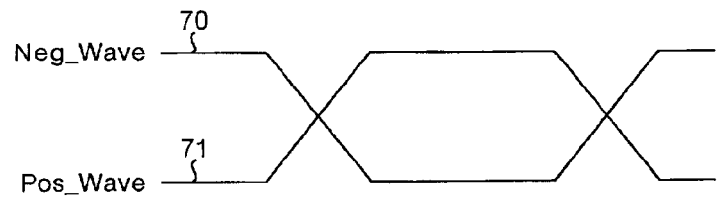
FIG.10B
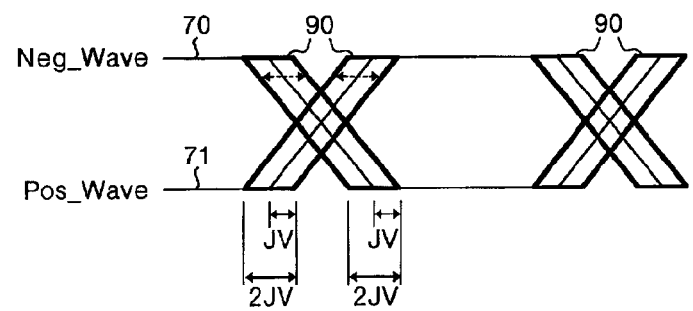

FIG.16A

```
EYEBIT      [Input Bit Pattern]
BITWIDTH    [Bit-Width]
EYEEVENT    [Eye Pattern Event]
DUMMYEVENT  [Dummy Event]
```
(150)

FIG.16B

```
PRBS 27-1  000000111  1110111110  0111101011  1000011011  1010011000
           1010110000  0101111000  1110110110  0100101001  0000100111
           0010110100  0100011001  1010101
K28.5      1100000101
K28.7      1100000111
```
(151)

FIG.16C

```
EYEBIT      1011011100
BITWIDTH    1250 ;
EYEEVENT    100 ;
DUMMYEVENT  3 ;
```
(152)

```
1011011100          1011011100
1011011100          1011011100
1011011100          1011011100
                       ⋮
                    1011011100
```
(153)

- NUMBER OF EVENTS→3
- WAVEFORM→NON-DISPLAY
- EYE PATTERN WAVEFORM
  →NON-DETERMINATION

- NUMBER OF EVENTS→100
- WAVEFORM→DISPLAY
- EYE PATTERN WAVEFORM
  →DETERMINATION

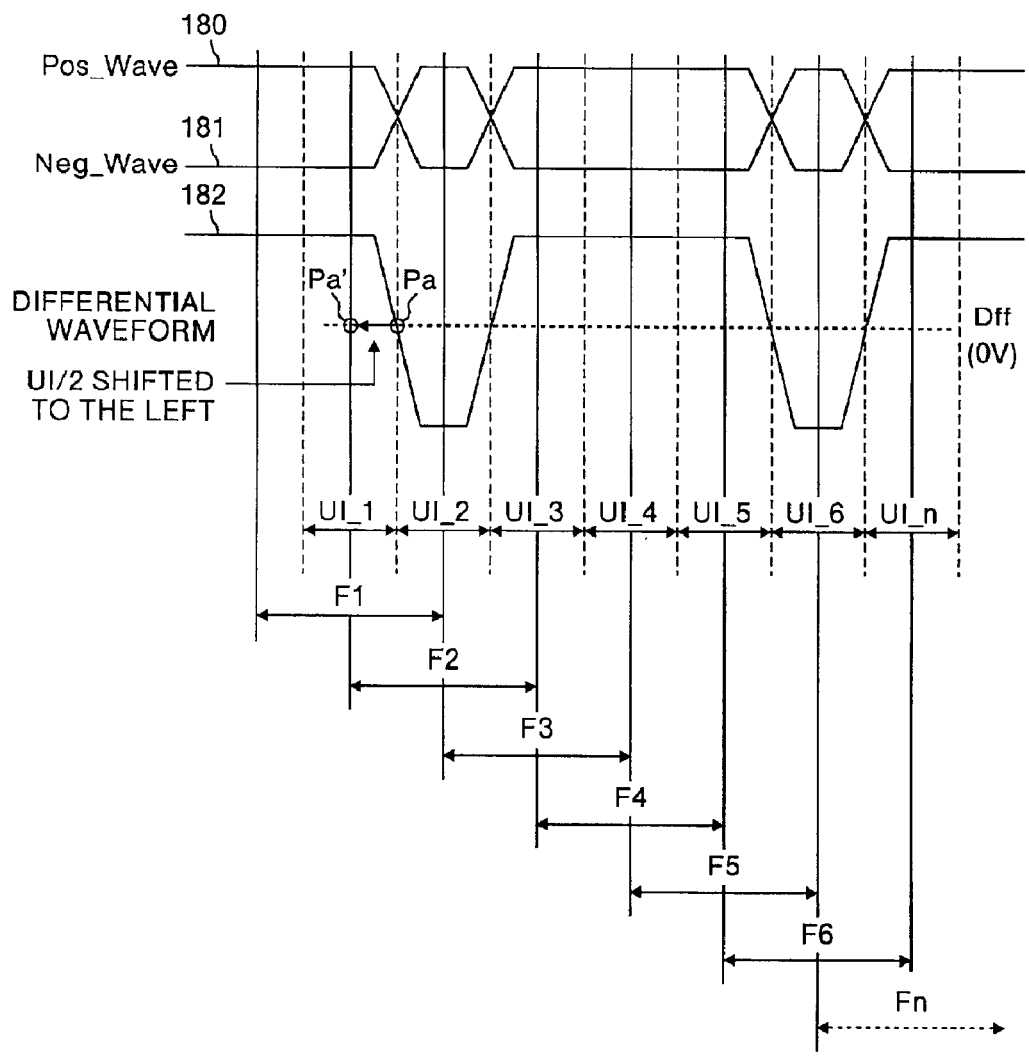

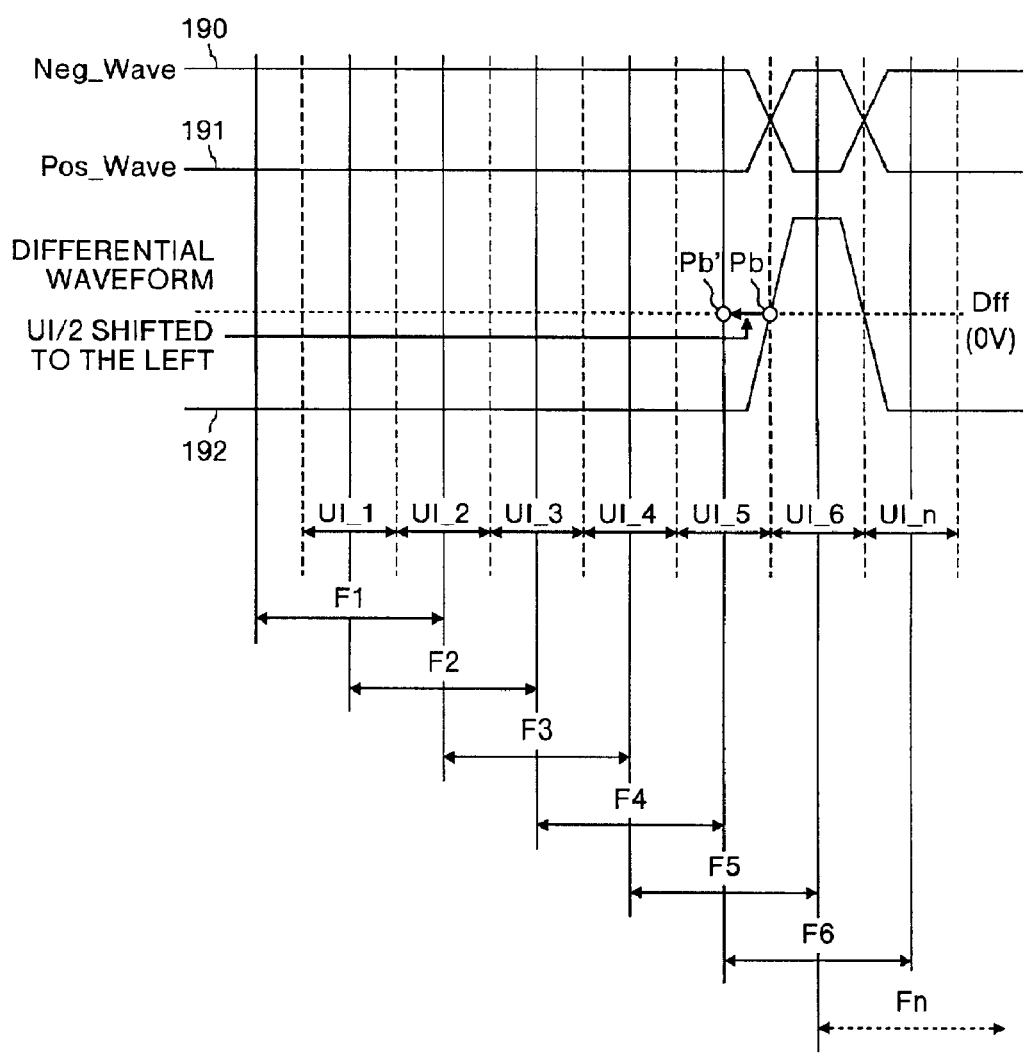

- Pos_Wave

| PWL | | | 1ns | 0v |
|---|---|---|---|---|
| + | 1.01ns | 3.3v | 1.99ns | 3.3v |
| + | 2ns | 0v | 2.98ns | 0v |
| + | 2.99ns | 3.3v | 7.89ns | 3.3v |
| + | 7.90ns | 0v | 8.88ns | 0v |
| + | 8.89ns | 3.3v | ............ | |
| + | ............ | | | |

- Neg_Wave

| PWL | | | 1ns | 3.3v |
|---|---|---|---|---|
| + | 1.01ns | 0v | 1.99ns | 0v |
| + | 2ns | 3.3v | 2.98ns | 3.3v |
| + | 2.99ns | 0v | 7.89ns | 0v |
| + | 7.90ns | 3.3v | 8.88ns | 3.3v |
| + | 8.89ns | 0v | ............ | |
| + | ............ | | | |

METHOD OF AND APPARATUS FOR SIGNAL-WAVEFORM SIMULATION, AND COMPUTER PRODUCT

FIELD OF THE INVENTION

The present invention relates to a technology used for the random-pattern analysis, skew analysis, jitter analysis, and eye-pattern analysis of differential signal or ordinary signal.

BACKGROUND OF THE INVENTION

Operation frequencies of information processing equipment such as network units or personal computer have been remarkably raised recently from megahertz to gigahertz. Thereby, a waveform analysis considering influences of various noises is requested also for a high-frequency signal for transmitting a wiring pattern of a printed circuit board.

A circuit designer of an integrated circuit and the like selects a circuit device constituting a circuit and a parameter for controlling the characteristic of the circuit device so that operations of the circuit are suited to a purposed specification before designing the circuit.

At the present when the computer art is developed, a circuit simulator is used for circuit design. The circuit simulator simulates a circuit operation on a computer without fabricating an actual circuit and shows the circuit operation for a designer. The simulator operated by the software referred to as SPICE2 developed by University of California at Berkley in 1972 is publicly known.

For example, in the case of an analysis using the above circuit simulator, a simulation is executed in accordance with the connection data between circuit devices constituting a circuit to be analyzed and device parameters to estimate the number of noises under a predetermined operational state of each circuit device and display or print the estimated number of noises.

Moreover, a random-pattern analysis has been performed so far, in which the waveform of a random pattern is falsely generated to analyze the reflection characteristic when the random pattern is transmitted to the circuit. As shown in FIG. 26A, the waveform of the random pattern shows a differential waveform constituted of a negative waveform 70 and a positive waveform 71.

Because the differential waveform makes it possible to cancel noises by using the difference between the negative waveform 70 and positive waveform 71 even if noises are superimposed on the negative waveform 70 and positive waveform 71, it is a waveform having a high noisiness. Moreover, the differential waveform is defined as bit 0 when the positive waveform 71 is equal to 0 V and bit 1 when the positive waveform 71 is equal to 3 V.

The above random pattern is obtained by combining the bit 1 and the bit 0 at random, in which the reflection characteristic is almost certainly deteriorated in the case of a specific combination. Therefore, by intentionally falsely transmitting a random pattern to the circuit, it is possible to determine good or bad of the reflection characteristic.

To generate the waveform of a random pattern by a conventional circuit simulator, it is necessary to carefully manually set rise and fall timings of the positive waveform 71 (Pos_Wave) and the negative waveform 70 (Neg_Wave) as shown in FIG. 26B.

As described above, the conventional circuit simulator shows the power in a waveform analysis up to approx. 100 MHz and is greatly supported by various designers. Because frequencies of information equipment have been remarkably raised recently and are reaching a gigahertz band from a megahertz band, a waveform analysis considering influences of various noises is requested for a high-frequency signal for transmitting a wiring pattern to a printed circuit board.

However, the conventional circuit simulator has a problem that it is not easy to correspond to signal analyses such as the skew analysis, jitter analysis, and eye-pattern analysis of a high-frequency differential signal and a general signal.

Moreover, as described by referring to FIG. 26A and FIG. 26B, in the case of the conventional circuit simulator, it is necessary to carefully manually set rise and fall timings of the positive waveform 71 and negative waveform 70. Therefore, the conventional circuit simulator has problems that the above operation is very troublesome and requires a lot of time and it is not easy to perform a random-pattern analysis.

SUMMARY OF THE INVENTION

It is an object of this invention to provide a method of and apparatus for signal-waveform simulation using the random-pattern analysis, skew analysis, jitter analysis, and the eye-pattern analysis of high-frequency differential waveforms or ordinary signal waveforms. It is another object of this invention to provide a computer readable recording medium that stores a computer program which when executed realizes the method according to the present invention.

The apparatus for signal-waveform simulation according to one aspect of this invention comprises a model generation unit which generates a signal-analysis simulation model in accordance with high-frequency-circuit design information; a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform; and a skew analysis unit which skews the random-pattern waveform or the differential waveform in accordance with a preset skew width.

The apparatus for signal-waveform simulation according to another aspect of this invention comprise a model generation unit which generates a signal-analysis simulation model in accordance with high-frequency-circuit design information; a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform; and a setting unit which sets a region to be excluded from a range to be analyzed in the random-pattern waveform or the differential waveform.

The apparatus for signal-waveform simulation according to another aspect of this invention comprise a model generation unit which generates a signal-analysis simulation model in accordance with high-frequency-circuit design information; a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform; and an eye-pattern analysis unit which generates an eye-pattern waveform by superimposing waveforms obtained by frame-dividing the random-pattern waveform or the differential waveform by a division width that includes a waveform of one bit and is of one data width or wider.

Other objects and features of this invention will become apparent from the following description with reference to the accompanying drawings.

BRIEF DESCRIPTION OF THE DRAWINGS

FIG. 3 is a flowchart for explaining operations of the embodiment in FIG. 1;

FIG. 9A and FIG. 9B are illustrations for explaining a command under a jitter analysis in the embodiment in FIG. 1;

FIG. 10A and FIG. 10B are illustrations for explaining a jitter analysis in the embodiment in FIG. 1;

FIG. 16A to FIG. 16C are illustrations for explaining another random-pattern waveform generation method in the embodiment in FIG. 1;

FIG. 21 is an illustration for explaining processing of frame-dividing in the embodiment in FIG. 1;

FIG. 22 is an illustration for explaining processing of frame-dividing in the embodiment in FIG. 1;

DESCRIPTION OF THE PREFERRED EMBODIMENTS

Embodiment/s of a method of and apparatus for signal-waveform simulation, and a computer product according to the present invention is/are described below in detail by referring to the accompanying drawings.

Figure 1:
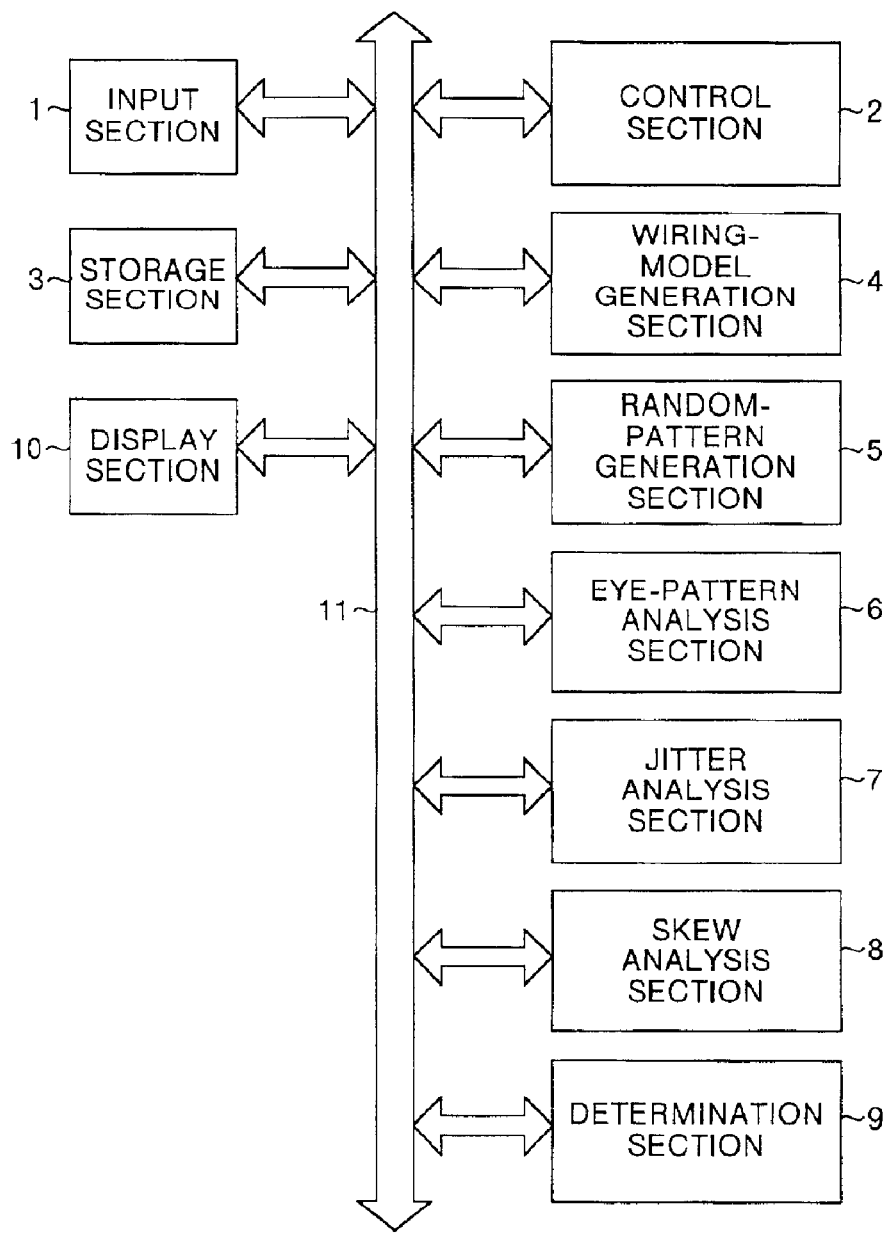
FIG. 1 is a block diagram showing a configuration of an embodiment of the present invention.

FIG. 1 is a block diagram showing an embodiment of the present invention. FIG. 1 shows, for example, a configuration of a signal-waveform simulation apparatus to be applied to high-frequency-circuit design. The signal-waveform simulation apparatus is an apparatus for executing the random-pattern analysis, eye-pattern analysis, jitter analysis, and skew analysis of a high-frequency signal for transmitting a circuit to be designed (e.g. printed board circuit).

Figure 2:
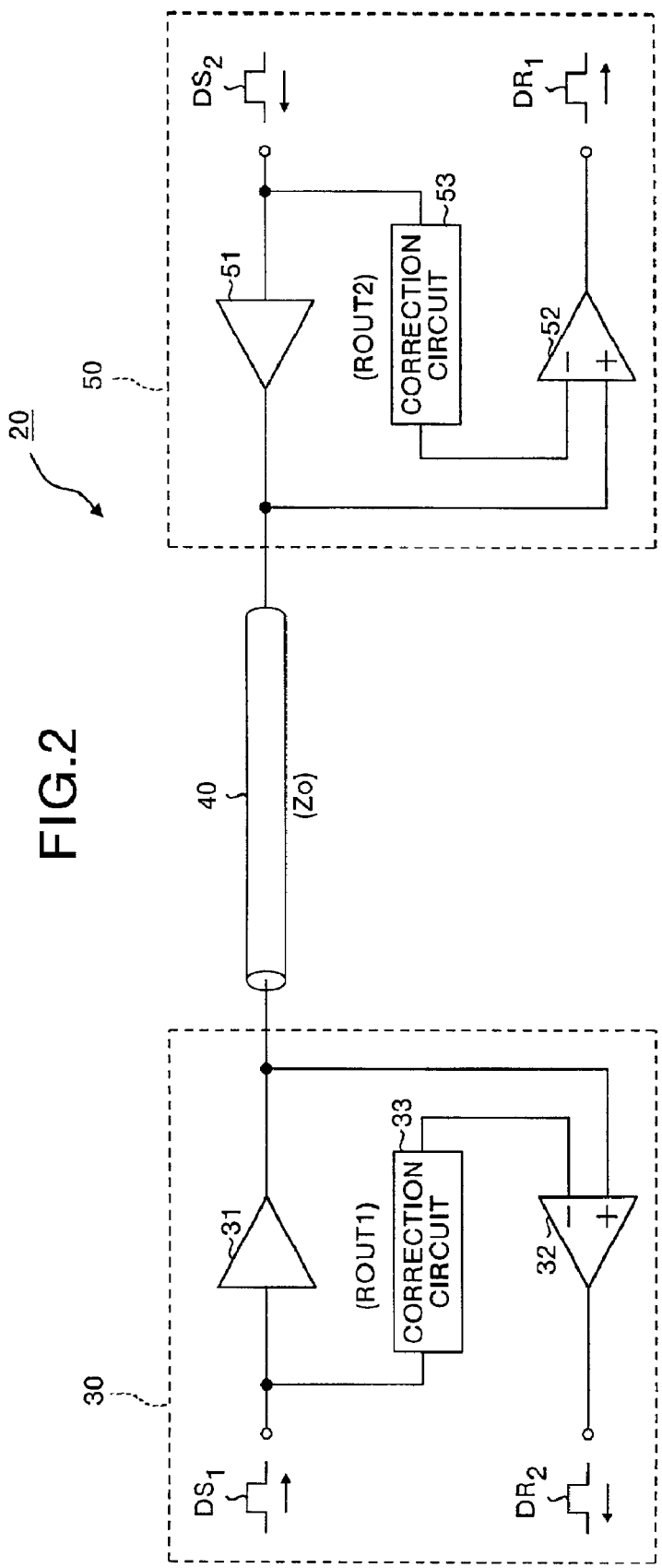
FIG. 2 is an illustration showing a signal transmission circuit 20 in the embodiment in FIG. 1.

The input section 1 is used to input the wiring data, the parameter, and various commands of a circuit to be designed. FIG. 2 is an illustration showing a signal transmission circuit 20 as an example of the above circuit. The signal transmission circuit 20 shown in FIG. 2 serves as a circuit capable of performing bidirectional signal transfer between transceiving circuits 30 and 50 through a printed wiring 40 (transmission line).

In the printed wiring 40, a superimposed signal between a transmitter signal $DS_1$ transmitted from a driver 31 and a transmitter signal $DS_2$ transmitted from a driver 51 is transmitted. The characteristic impedance of the printed wiring 40 is assumed as $Z_0$. In the transceiving circuit 30, the driver 31 serves as a circuit for transmitting the transmitter signal $DS_1$ to the transceiving circuit 50 through the printed wiring 40.

The output resistance of the driver 31 is assumed as an output resistance $R_{out1}$. A correction circuit 33 outputs the transmitter signal $DS_1$ to a receiver 32 as a correction signal. The receiver 32 receives the transmitter signal $DS_2$ as a receiver signal $DR_2$ by obtaining the difference between the superimposed signal (transmitter signal $DS_1$+transmitter signal $DS_2$) sent from the printed wiring 40 and the correction signal (transmitter signal $DS_1$) generated by the correction circuit 33.

In the transceiving circuit 50, the driver 51 serves as a circuit for transmitting the transmitter signal $DS_2$ to the transceiving circuit 30 through the printed wiring 40. The output resistance of the driver 51 is assumed as an output resistance $R_{out2}$. A correction circuit 53 outputs the transmitter signal $DS_2$ to a receiver 52 as a correction signal. The receiver 52 receives the transmitter signal $DS_1$ as a receiver signal $DR_1$ by obtaining the difference between the superimposed signal (transmitter signal $DS_1$+transmitter signal $DS_2$) sent from the printed wiring 40 and the correction signal (transmitter signal $DS_2$) generated by the correction circuit 53. Moreover, in the case of the signal transmission circuit 20, it is necessary to match the characteristic impedance $Z_0$ with the output resistance $R_{out1}$ (output resistance $R_{out2}$) in order to prevent reflection of a signal.

In FIG. 1, a control section 2 controls various sections and mainly performs the control for signal analysis. Details of operations of the control section 2 will be described later. A storage section 3 stores wiring data and parameters. A wiring-model generation section 4 generates a wiring model for signal analysis in accordance with the above wiring data.

Figure 5A:
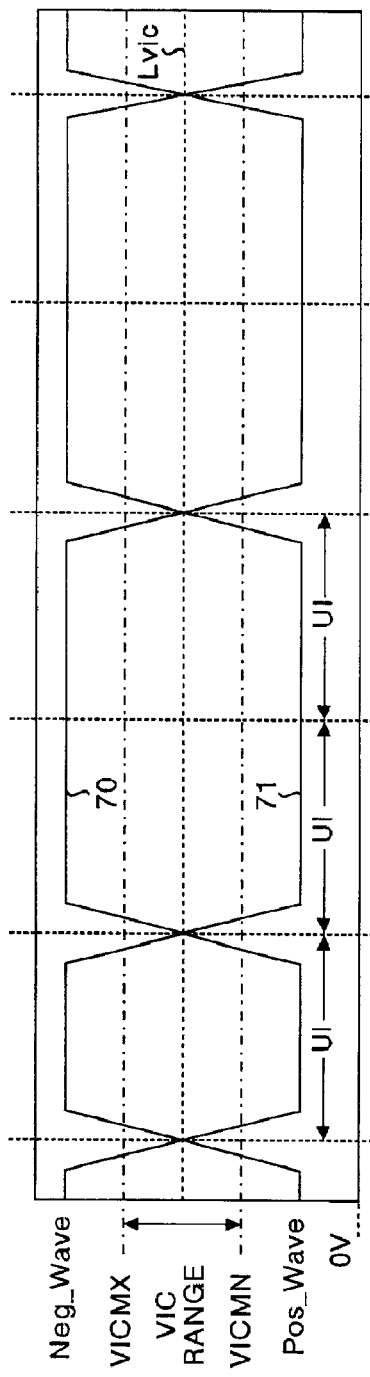
FIG. 5A and FIG. 5B are illustrations showing a random-pattern waveform in the embodiment in FIG. 1.
Figure 5B:
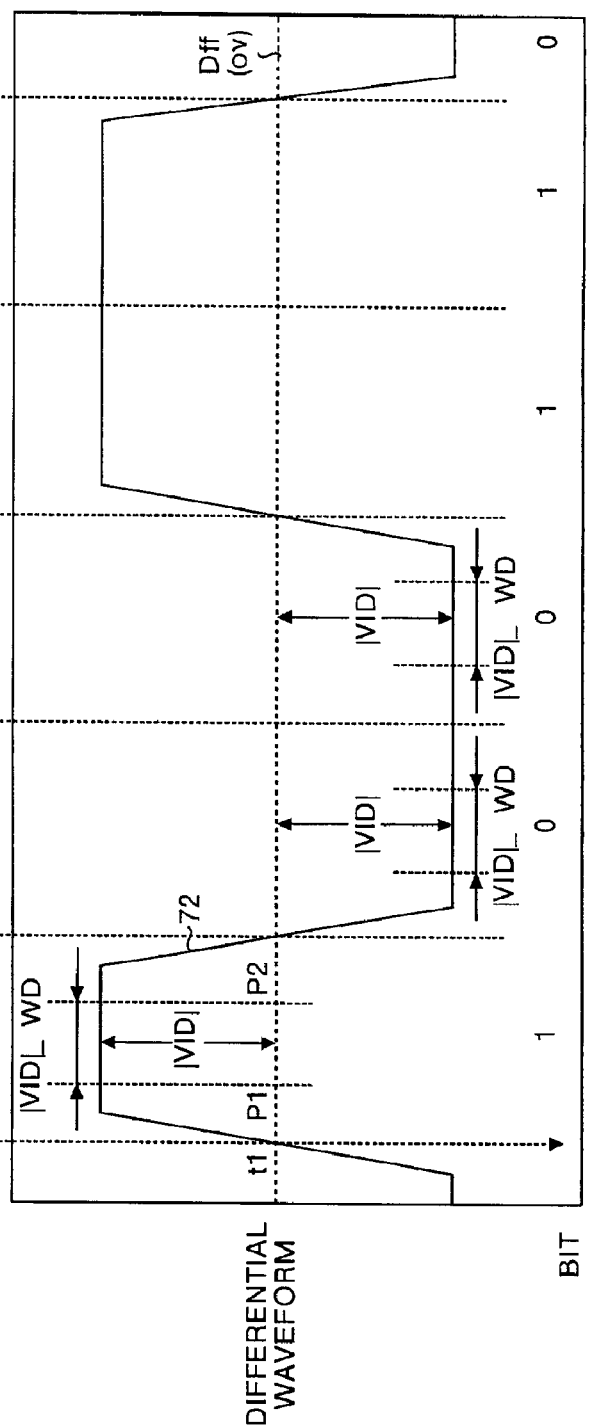

A random-pattern analysis section 5 performs a random-pattern analysis in accordance with a signal of a bit string comprising a random combination between 0 and 1 referred to as a random pattern (refer to FIG. 5A and FIG. 5B). An eye-pattern analysis section 6 generates an eye pattern (refer to FIG. 12A and FIG. 12B) by superimposing random patterns every data width (UI: Unit Interval) to analyze the eye pattern.

A jitter analysis section 7 performs a jitter analysis of falsely generating jitter (refer to FIG. 10B) in a random-pattern waveform comprising the negative waveform 70 and positive waveform 71 shown in FIG. 10A. A skew analysis section 8 performs a skew analysis of falsely generating a skew (phase difference) between the negative waveform 70 and positive waveform 71 shown in FIG. 7A and FIG. 8A. A determination section 9 determines whether a differential waveform and an eye pattern meet predetermined criteria. A display section 10 is a display for displaying a series of analysis results above described. A bus 11 connects various sections of the apparatus.

Operations of the above embodiment are described by referring to the flowchart shown in FIG. 3. In step SA1, a wiring pattern for a circuit to be simulated is designed. A parameter corresponding to the wiring pattern is input from the input section 1. In this case, the following parameters used for various types of determinations to be described later are also input from the input section 1.

VIDMX: MAX (maximum value) of Magnitude differential Input Voltage (|VID|) (Refer to FIG. 6C.)
  Unit: [V] that can be designated up to the third decimal place.
VIDMN: MIN (minimum value) of Magnitude differential Input Voltage (|VID|) (Refer to FIG. 6C.)
  Unit: [V] that can be designated up to the third decimal place.
|VID|_WD: Differential voltage amplitude |VID| determination time interval showing what-percent time interval of one data width (UI: Unit Interval) of a random pattern (Refer to FIG. 6C.)
  Unit: [%] that can be designated up to the third decimal place
VICMX: Common mode Input Voltage (VIC: MAX (maximum value) of common mode voltage amplitude) (Refer to FIG. 6A.)
  Unit: [V] that can be designated up to the third decimal place
VICMN: MIN (minimum value) of Common mode Input Voltage (VIC) (Refer to FIG. 6A.)
  Unit: [V] that can be designated up to the third decimal place
EYEXA: MIN (minimum value) of X-axis Eye Diagram Mask EYEXA (Refer to FIG. 13A.)
  Unit: [ps] that is designated by an integer
EYEXB: MIN (minimum value) of X-axis Eye Diagram Mask EYEXB (Refer to FIG. 13A.)
  Unit: [Ps] that is designated by an integer
EYEYA: MIN (minimum value) of Y-axis Eye Diagram Mask EYEYA (Refer to FIG. 13A.)
  Unit: [V] that can be designated up to the third decimal place The control section 2 stores the parameters in the storage section 3 and simultaneously starts the wiring-model generation section 4. In step SA2, the wiring-model generation section 4 executes the wiring modeling for modeling a wiring pattern in accordance with the above parameters. In step SA3, the processing for generating the above random pattern is executed. Specifically, a user inputs a random-pattern generation command 60 having the format shown in FIG. 4A. The random-pattern generation command 60 is a command for generating the random-pattern waveform shown in FIG. 5A corresponding to the random bit string 63 shown in FIG. 4D.

In the random-pattern generation command 60, EYEBIT (Input Bit Pattern) is used to set a random bit (random combination between 0 and 1) corresponding to a random-pattern waveform. In the case of the embodiment, [Input Bit Pattern] and the random-bit-pattern format 61 shown in FIG. 4B are prepared so as to be easily designated by a user.

Figures 4A, 4B, 4C, 4D:
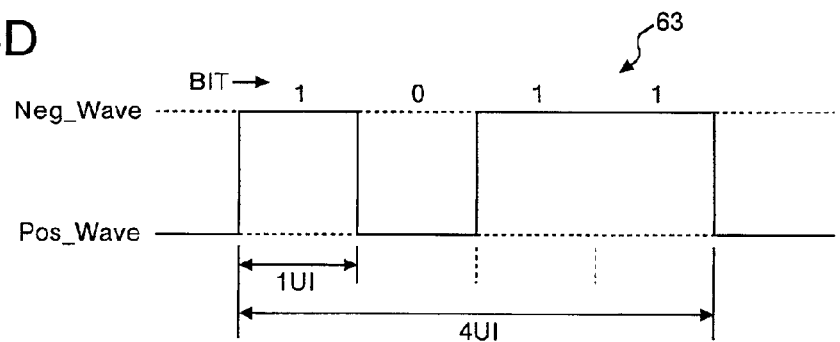
FIG. 4A to FIG. 4D are illustrations for explaining a random-pattern generation method in the embodiment in FIG. 1.

BITWIDTH [Bit-Width] sets one bit width of the random bit string 63 shown in FIG. 4D. EYEEVENT [Eye-pattern Event] sets the number of repetitions of a bit pattern set in accordance with EYEBIT [Input Bit Pattern]. FIG. 4C illustrates a setting example of a random-pattern generation command 62.

Moreover, when the random-pattern generation command 62 is input, the random-pattern analysis section 5 generates a random-pattern waveform constituted of the positive waveform 71 and negative waveform 70 shown in FIG. 5A and the differential waveform 72 shown in FIG. 5B in step SA4. The random-pattern waveform and differential waveform 72 correspond to random-pattern bits. The differential waveform 72 is a waveform obtained by using the difference between the positive waveform 71 and negative waveform 70 (positive waveform 71-negative waveform 70). The analysis result of the random pattern is displayed on the display section 10 in step SA11 to be described later.

In step SA5, the control section 2 determines whether a skew analysis command is input from the input section 1. When the determination result is "No", the control section 2 performs the determination in step SA7. However, when the determination result in step SA5 is "Yes", the control section 2 starts the skew analysis section 8. Thereby, in step SA6, the skew analysis section 8 executes the processing of skewing the positive waveform 71 or negative waveform 70 in the random-pattern waveform shown in FIG. 5A.

Figures 7A, 7B:
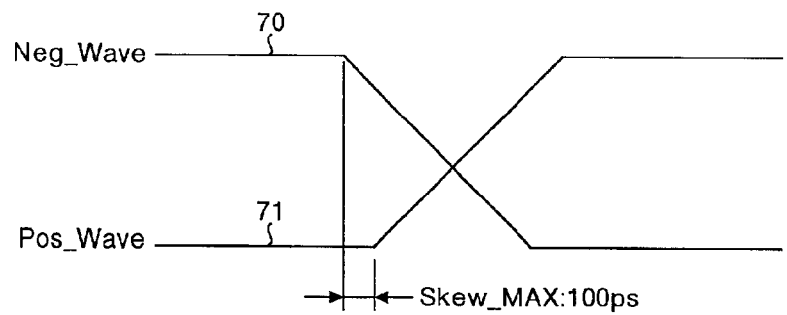
FIG. 7A and FIG. 7B are illustrations for explaining an skew analysis in the embodiment in FIG. 1.

To skew the positive waveform 71, a user sets rise and fall timings of the positive waveform 71 (Pos_Wave) and negative waveform 70 (Neg_Wave) as shown in FIG. 7B. In this case, as shown in FIG. 7A, the timings are set so that the phase of the positive waveform 71 (Pos_Wave) delays from that of the negative waveform 70 (Neg_Wave) by 100 ps (Skew_Max).

Figures 8A, 8B:
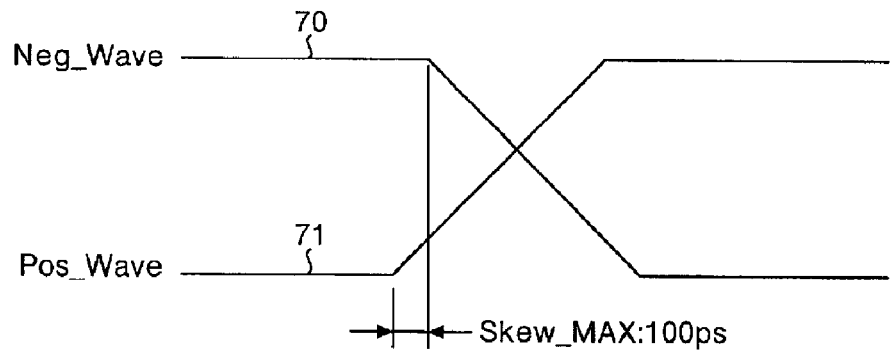
FIG. 8A and FIG. 8B are illustrations for explaining a skew analysis in the embodiment in FIG. 1.

However, to skew a negative waveform 70, the user sets rise and fall timings of the positive waveform 71 (Pos_Wave) and negative waveform 70 (Neg_Wave) as shown in FIG. 8B. In this case, as shown in FIG. 8A, the timings are set so that the phase of the negative waveform 70 (Neg_Wave) delays from that of the positive waveform 71 (Pos_Wave) by 100 ps (Skew_Max). The skew analysis results are displayed on the display section 10 in step SA11 to be described later.

In step SA7, the control section 2 determines whether a jitter addition command (refer to FIG. 9) is input from the input section 1. When the determination result is "No", the control section 2 performs the determination in step SA9. However, when the determination result in step SA7 is "Yes", the control section 2 starts the jitter analysis section 7. Thereby, in step SA8, the jitter analysis section 7 executes the jitter analysis of generating jitter in the positive waveform 71 and negative waveform 70 in the random-pattern waveforms shown in FIG. 10A and FIG. 10B.

In this case, the jitter addition command 80 shown in FIG. 9A is input by a user. In the jitter addition command 80, ADDJITTER [Jitter_Value] designates a jitter value (ps) to be added to the negative waveform 70 and positive waveform 71 shown in FIG. 10A, which corresponds to the JV (jitter addition value) shown in FIG. 10B. FIG. 9B illustrates a jitter addition command 81 as a designation example.

Moreover, the jitter analysis section 7 causes jitter by executing the jitter addition command 80 and swinging the negative waveform 70 and positive waveform 71 rightward and leftward by the jitter addition value JV (total of 2 JV) as shown in FIG. 10B. The jitter analysis result is displayed on the display section 10 in step SA11 to be described later. In this case, the jitter analysis section 7 also displays a bold line 90 in order to make a portion where jitter occurs clear as shown in FIG. 10B.

Figure 11A:
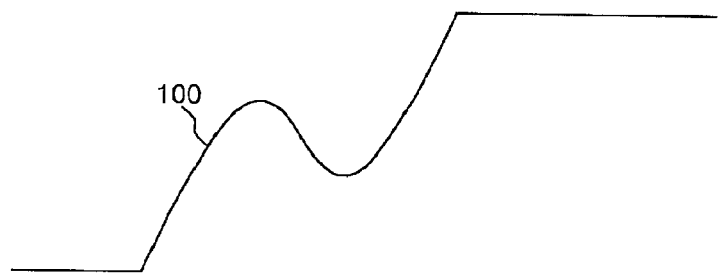
FIG. 11A to FIG. 11C are illustrations for explaining a jitter analysis in the embodiment in FIG. 1.
Figure 11B:
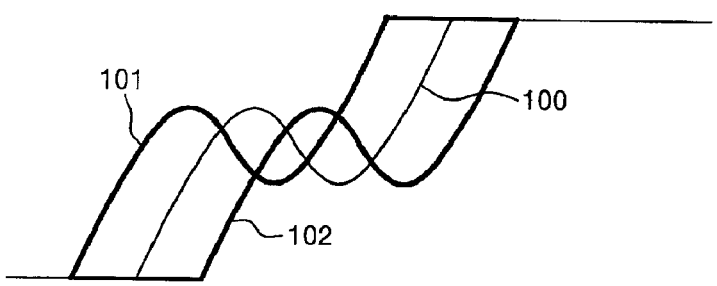
Figure 11C:
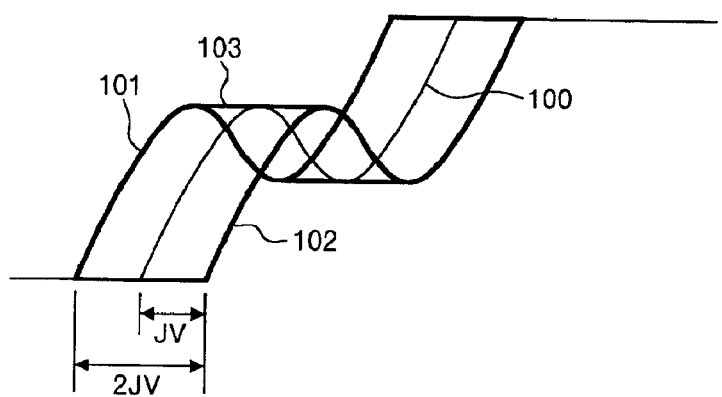

Moreover, FIG. 11A to FIG. 11C illustrate the jitter analysis of another waveform. In this case, the jitter analysis section 7 swings the waveform 100 shown in FIG. 11A rightward and leftward by a predetermined jitter addition value JV as shown in FIG. 11B. A waveform 101 is a waveform when the waveform 100 is maximally swung leftward and a waveform 102 is a waveform when the waveform 100 is maximally swung rightward. In this case, the jitter analysis section 7 also displays an envelope 103 shown by a bold line in order to make a portion where jitter occurs clear as shown in FIG. 11C.

In step SA9, the control section 2 determines whether an eye-pattern analysis command is input from the input section 1. When the determination result is "No", the control section 2 executes the processing in step SA10. However, when the determination result in step SA9 is "Yes", the control section 2 starts the determination section 9. Thereby, the determination section 9 determines good or bad of an eye pattern from step SA12 to step SA14.

Good or bad is determined for the following three cases.
(Case 1) Eye-pattern analysis of a random-pattern waveform to which skew analysis is not applied
(Case 2) Eye-pattern analysis of a random-pattern waveform in which the positive waveform 71 delays from the negative waveform 70 by Skew_MAX as shown in FIG. 7A
(Case 3) Eye-pattern analysis of a random-pattern waveform in which the negative waveform 70 delays from the positive waveform 71 by Skew_MAX as shown in FIG. 8A Moreover, in the case of the good/bad determination of an eye pattern, cases are also determined in which a jitter analysis is applied to random-pattern waveforms of the above (case 1) to (case 3).

Figure 12A:
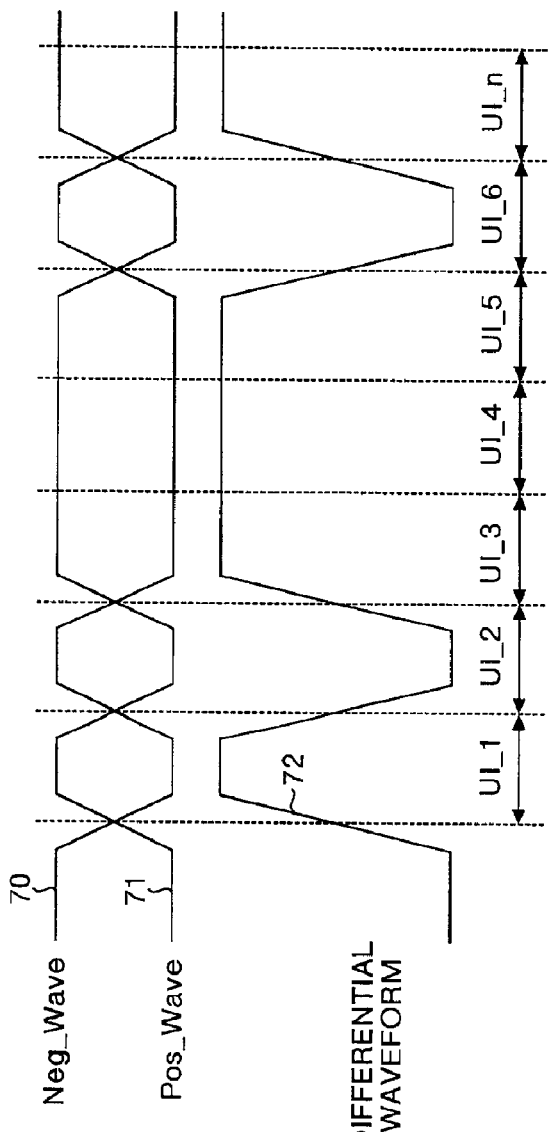
FIG. 12A and FIG. 12B are illustrations for explaining an eye-pattern analysis in the embodiment in FIG. 1.

In step SA12, the eye-pattern analysis section 6 executes the processing of frame-dividing a waveform by one data width (UI_1, UI_2, . . . , UI_n) as shown in FIG. 12A. In step SA13, the eye-pattern analysis section 6 superimposes the frame-divided waveforms as shown in FIG. 12B and FIG. 13B to display an eye-pattern waveform on the display section 10.

Figure 12B:
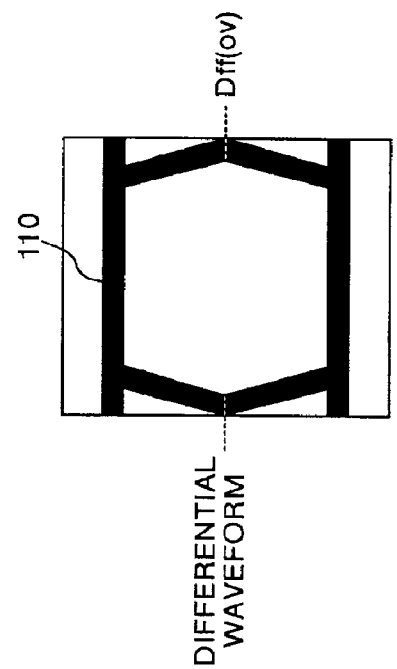

The eye-pattern waveform 110 shown in FIG. 12B is obtained by superimposing the frame-divided differential waveforms 72 shown in FIG. 12A. The eye-pattern waveform 130 shown in FIG. 13B is obtained by superimposing the frame-divided random-pattern waveforms (negative waveform 70 and positive waveform 71) shown in FIG. 12A.

Figure 13A:
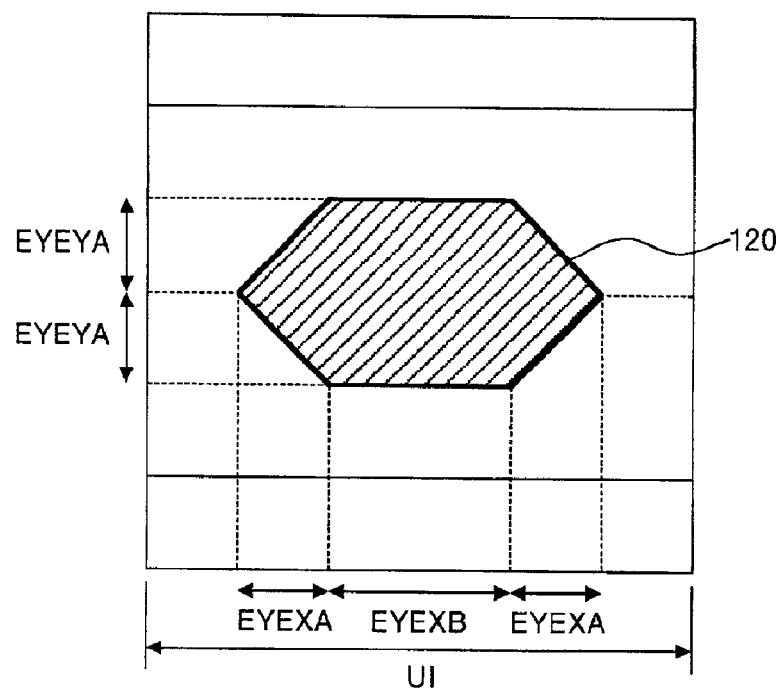
FIG. 13A to FIG. 13C are illustrations for explaining an eye-pattern analysis in the embodiment in FIG. 1.
Figure 13B:
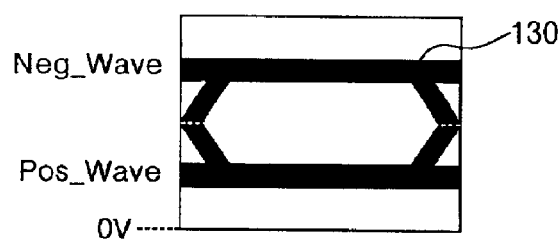
Figure 13C:
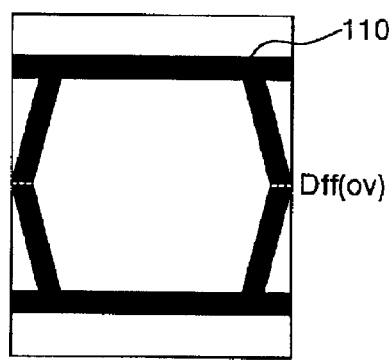

In step SA14, the determination section 9 determines qualities of the eye-pattern waveforms 130 and 110 shown in FIG. 13B and FIG. 13C in accordance with the reference eye pattern 120 shown in FIG. 13A. These eye-pattern waveforms 130 and 110 are better as a determination result as the area of an eye (inner portion) increases.

Specifically, when the eye portion of the eye-pattern waveform 130 or 110 even slightly enters the reference eye pattern 120, the determination section 9 sets the determination result to "bad". In this case, the determination section 9 displays waveforms corresponding to an error bit and two bits before and after the error bit among those constituting the eye-pattern waveform 130 or 110.

Moreover, when the eye portion of the eye-pattern waveform 130 or 110 does not enter the reference eye pattern 120, the determination section 9 sets the determination result to "good". In step SA11, the above analysis results are displayed on the display section 10.

However, when the determination result in step SA9 is "No", the determination section 9 performs good/bad determinations of the random-pattern waveform shown in FIG. 5A and the differential waveform 72 shown in FIG. 5B in step SA10. Good/bad determination is performed for the following three cases.
(Case 1) Good/bad determination when a skew analysis is not performed
(Case 2) Good/bad determination when the positive waveform 71 delays from the negative waveform 70 by Skew_MAX as shown in FIG. 7A
(Case 3) Good/bad determination when the negative waveform 70 delays from the positive waveform 71 by Skew_MAX as shown in FIG. 8A Moreover, for the embodiment, cases are good/bad-determined in which a jitter analysis is applied to random-pattern waveforms of the above (Case 1) to (Case 3).

Specifically, the determination section 9 determines whether the value of (((value of positive waveform 71)+ (value of negative waveform 70))/2) shown in FIG. 5A (hereafter referred to as VIC (common code voltage amplitude)) is kept in a preset VIC range (VICMN to VICMX). When VIC is kept in the VIC range, the good/bad determination result is assumed as "good". When VIC is not kept in the VIC range, the good/bad determination result is assumed as "bad".

Figure 6A:
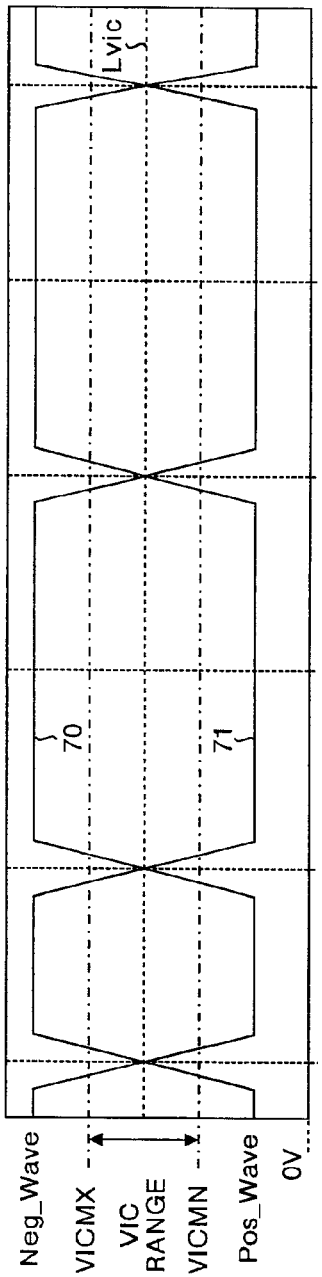
FIG. 6A to FIG. 6C are illustrations showing a random-pattern waveform in the embodiment in FIG. 1.
Figure 6B:
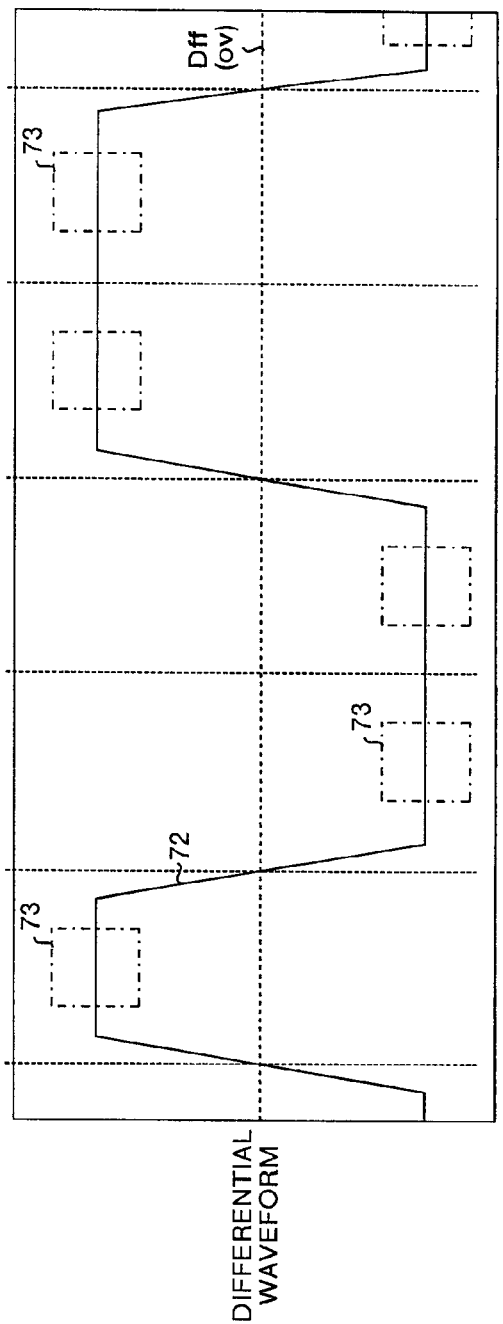
Figure 6C:
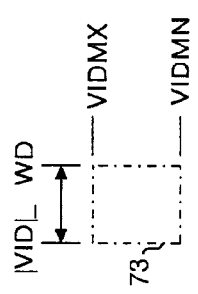

The determination section 9 determines whether the differential voltage amplitude |VID| ((value of positive waveform 71)−(value of negative waveform 70)) shown in FIG. 5B is kept in the reference range 73 shown in FIG. 6C, that is, between VIDMN and VIDMX in the whole |VID|_WD. When |VID| is kept in the reference range 73, the good/bad determination result is assumed as "good". When |VID| is not kept in the reference range 73, the good/bad determination result is assumed as "bad".

In step SA11, the random-pattern waveform and the differential waveform 72 shown in FIG. 6A and FIG. 6B are displayed on the display section 10 and the good/bad determination result in step SA10 is displayed.

An example is described above in which goodness or badness of the eye-pattern is determined according to the random-pattern waveform constituted of the positive waveform 71 and negative waveform 70 (refer to FIG. 5A), and the differential waveform 72 (refer to FIG. 5B), which are generated by the random-pattern generation command 62.

In other words, by the random-pattern generation command 62 shown in FIG. 4C, the random-pattern waveform and differential waveform in which a bit pattern "1011011100" (EYEBIT) is repeated five hundred times (EYEEVENT), are generated.

Figure 14A:
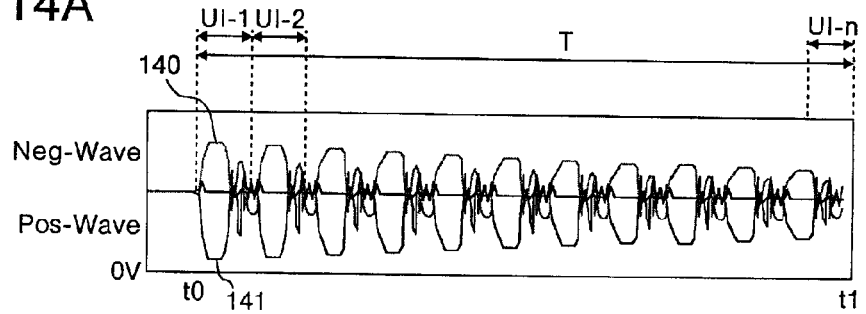
FIG. 14A and FIG. 14B are illustrations showing an unstable region of the random-pattern waveform in the embodiment in FIG. 1.
Figure 14B:
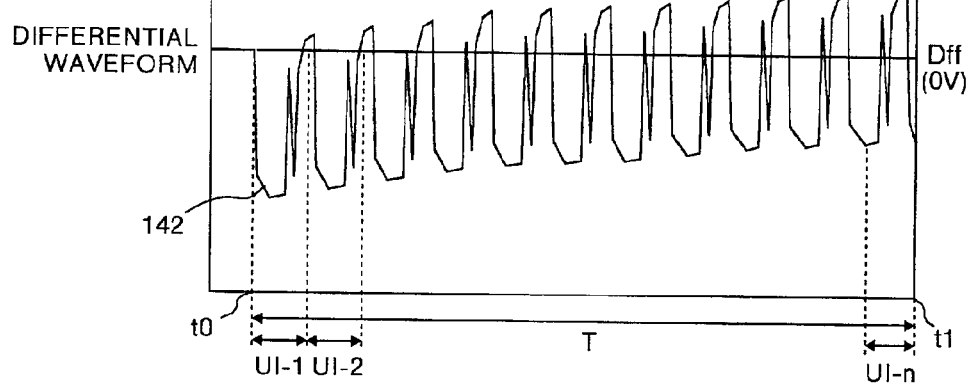

When a capacitance component of a coupling capacitor is included for example in the printed wiring 40 (transmission line) shown in FIG. 2, as a transient phenomenon, unstable regions in the random-pattern waveform and differential waveform as shown in FIG. 14A and 14B may be generated. The unstable regions are often generated at the initial stage of the above-explained repetitions of the bit pattern, and have adverse effects on the eye-pattern determination.

The adverse effects on the eye-pattern determination caused by the unstable regions will be explained below. FIG. 14A shows a random-pattern waveform constituted of a negative waveform 140 and positive waveform 141 at an initial stage of the repetitions. The initial stage referred to here means a transition period T (from time t0 to time t1) during the first to third repetitions. The random-pattern waveform becomes stable at and after time t1.

Thus in the transition period T, there is a bit pattern of 30 bits (one data width equivalent to UI_1-UI_n) constituted of "1011011100" (first repetition), "1011011100" (second repetition) and "1011011100" (third repetition).

In contrast to the random-pattern waveform in the stable region shown in FIG. 5A, the random-pattern waveform shown in FIG. 14A obviously has an unstable amplitude and is distorted and unsuitable for eye-pattern determination.

A differential waveform 142 shown in FIG. 14B is a waveform obtained by using the difference between the positive waveform 141 and negative waveform 140 (positive waveform 141—negative waveform 140). The differential waveform 142, like the random-pattern waveform (refer to FIG. 14A), obviously has an unstable amplitude and is distorted and unsuitable for eye-pattern determination, in contrast to the differential waveform in the stable region shown in FIG. 5B.

To perform the eye-pattern determination, in step SA12 shown in FIG. 3, the eye-pattern analysis section 6 executes the processing of frame-dividing the random-pattern waveform (refer to FIG. 14A) and the differential waveform (refer to FIG. 14B) by one data width (UI_1, UI_2, ..., UI_n)

Figure 15A:
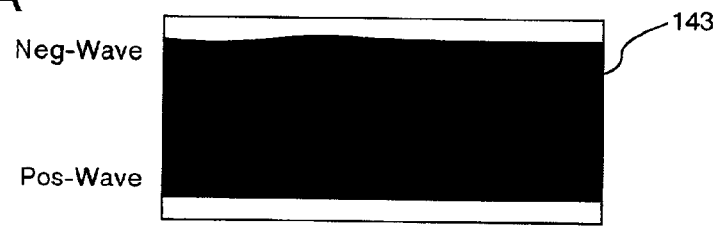
FIG. 15A and FIG. 15B are illustrations showing an eye-pattern waveform corresponding to the random-pattern waveform shown in FIG. 14A and FIG. 14B.
Figure 15B:

In step SA13, the eye-pattern analysis section 6 superimposes the frame-divided random-pattern waveforms and differential waveforms as shown in FIG. 15A and FIG. 15B to display eye-pattern waveforms 143 and 144 on the display section 10.

The eye-pattern waveform 143 shown in FIG. 15A is obtained by superimposing the frame-divided random-pattern waveforms (the negative waveform 140 and positive waveform 141) shown in FIG. 14A. The eye-pattern waveform 144 shown in FIG. 15B is obtained by superimposing the frame-divided differential waveforms 142 shown in FIG. 14B.

Since the "eyes" in the eye-pattern waveforms 143 and 144 are squashed, the above mentioned accurate good/bad determination of the eye-pattern cannot be performed.

Thus in the embodiment, a setting is carried out, in which the unstable regions (transition period T: refer to FIGS. 14A and 14B) in the random-pattern waveform and differential waveform are excluded from the ranges to be determined and displayed.

Specifically, in step SA3 shown in FIG. 3, the user inputs a random-pattern generation command 150 of the format shown in FIG. 16A. The random-pattern generation command 150 is a command for generating the random-pattern waveform corresponding to a random bit string.

In the random-pattern generation command 150, EYEBIT [Input Bit Pattern], BITWIDTH [Bit-Width] and EYEEVENT [Eye-pattern Event] are equivalent to those in the random-pattern generation command 60 (refer to FIG. 4A).

In other words, in the random-pattern generation command 150, EYEBIT [Input Bit Pattern] is used to set a random bit (random combination between 0 and 1) corresponding to the random-pattern waveform. In the embodiment, [Input Bit Pattern], and a random-bit-pattern format 151 shown in FIG. 16B are prepared so as to be easily designated by a user.

BITWIDTH [Bit-Width] sets a bit width of the random bit string. EYEEVENT [Eye-pattern Event] sets number of repetitions of the bit pattern set in accordance with EYEBIT [Input Bit Pattern].

DUMMYEVENT [Dummy Event] sets period of non-displaying the random-pattern waveform and the differential waveform and not performing eye-pattern determination, by the number of repetitions of the bit pattern. During the period set in accordance with DUMMYEVENT [Dummy Event] a waveform analysis is performed as the internal processing. A setting example of a random-pattern generation command 152 is shown in FIG. 16C.

In the random-pattern generation command 152, a random-pattern 153 (random-pattern waveform and differential waveform) in which a bit pattern, "1011011100" (EYEBIT) with a bit width (BITWIDTH) of one-thousand-two-hundred-and-fifty, is repeated one-hundred-and-three times (DUMMYEVENT+EYEEVENT).

As for the random-pattern 153, the random-pattern waveform and differential waveform of the random-pattern having a number of events of three (from first to third repetitions; referred to as a dummy event below) are not displayed on the display section 10 (refer to FIG. 1), and eye-pattern determination is not performed.

As for the case of the random-pattern after the dummy event, having a number of events of one hundred (from fourth to one-hundred-third repetitions), the random-pattern waveform and differential waveform are displayed on the display section 10 and eye-pattern determination is performed.

When the random-pattern generation command 152 is input, the random-pattern analysis section 5 generates a random-pattern waveform and differential waveform corresponding to the random-pattern 153 (refer to FIG. 16C) in step SA4 shown in FIG. 3. Therefore, the random-pattern waveform and differential waveform generated have unstable regions (from first to third repetitions) and stable regions (from fourth to one-hundred-third repetitions).

The results of the random-pattern analysis are displayed on the display section 10 in a later-described step SA11. The display section 10 displays the random-pattern waveform and differential waveform of the stable regions (refer to FIGS. 18A and 18B) excluding the above-mentioned unstable regions (refer to FIGS. 14A and 14B).

Figure 18A:
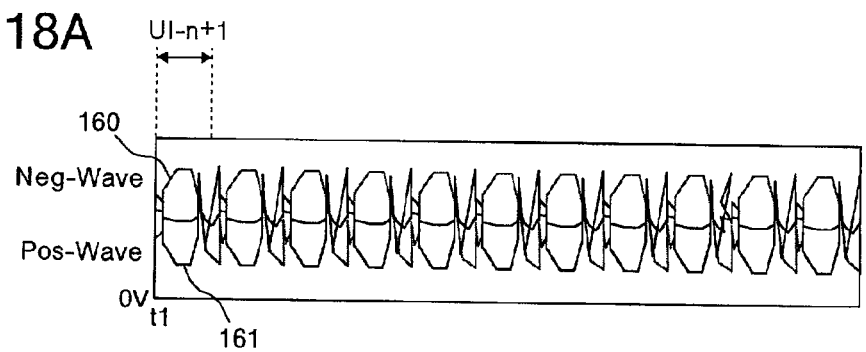
FIG. 18A and FIG. 18B are illustrations showing a stable region of the random-pattern waveform in the embodiment in FIG. 1.

FIG. 18A shows a random-pattern waveform constituted of a negative waveform 160 and positive waveform 161 beyond the third repetition. The random-pattern waveform obviously has a stable amplitude and a regular waveform in contrast to the random-pattern waveform of the unstable region shown in FIG. 14A.

Figure 18B:
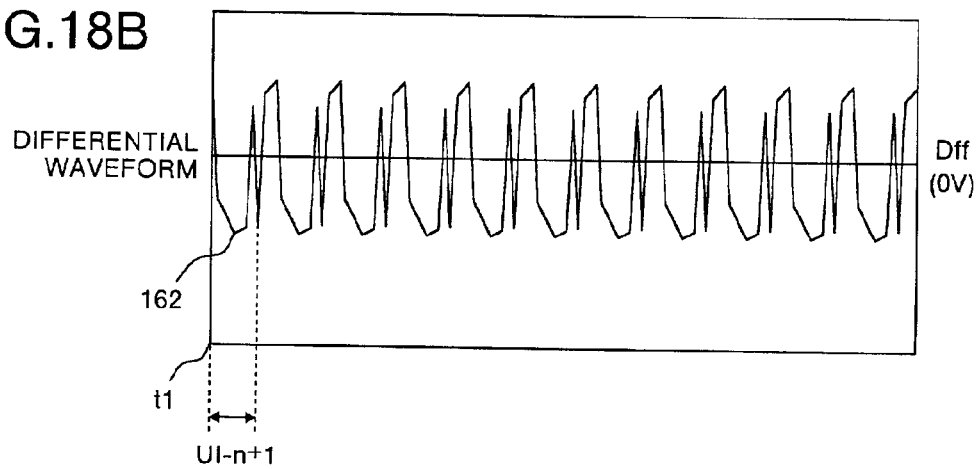

FIG. 18B shows a differential waveform 162 obtained by using the difference between the positive waveform 161 and negative waveform 160 (positive waveform 161—negative waveform 160) shown in FIG. 18A. The differential waveform 162 also has a stable amplitude and a regular waveform like the random-pattern waveform (refer to FIG. 18A).

To perform eye-pattern determination, the eye-pattern analysis section 6 executes the processing of frame-dividing the random-pattern waveform (refer to FIG. 18A) and differential waveform (refer to FIG. 18B) by one data width (UI_n+1, ...), in step SA12 shown in FIG. 3.

Figure 19A:
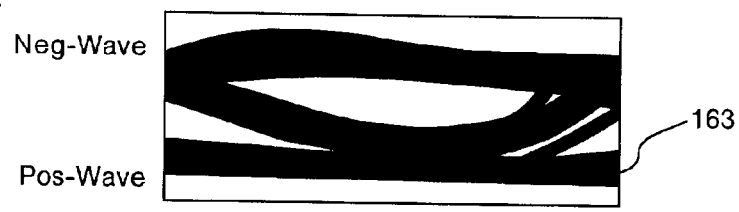
FIG. 19A and FIG. 19B are illustrations showing an eye-pattern waveform corresponding to the random-pattern waveform shown in FIG. 18A and FIG. 18B.
Figure 19B:
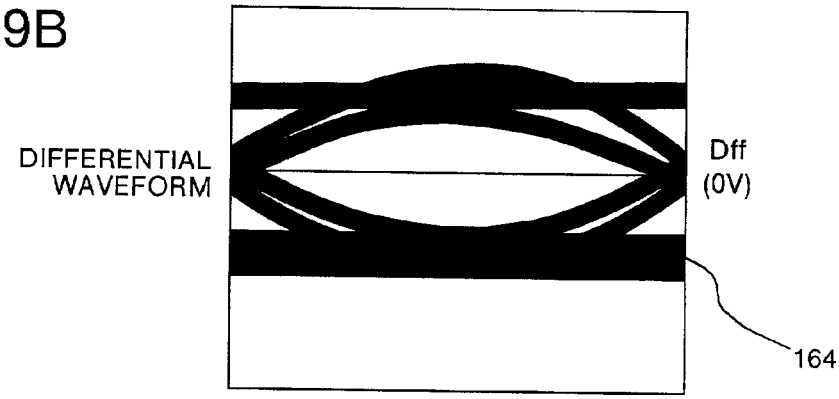

In step SA13, the eye-pattern analysis section 6 superimposes the frame-divided waveforms as shown in FIG. 19A and FIG. 19B to display eye-pattern waveforms on the display section 10.

The eye-pattern waveform 163 shown in FIG. 19A is obtained by superimposing the frame-divided random-pattern waveforms (negative waveform 160 and positive waveform 161) shown in FIG. 18A. The eye-pattern waveform 164 shown in FIG. 19B is obtained by superimposing the frame-divided differential waveforms 162 shown in FIG. 18B.

In the eye-pattern waveforms 163 and 164, it is obvious that "eyes" are clear and eye-pattern determination can be performed, in contrast to the eye-pattern waveforms 143 and 144 shown in FIGS. 15A and 15B.

In step SA14, the determination section 9, as explained above, determines good or bad of the eye-pattern waveforms 163 and 164 shown in FIGS. 19A and 19B according to the reference eye-pattern 120 shown in FIG. 13A. The above-described operations are executed after that.

Figure 17:
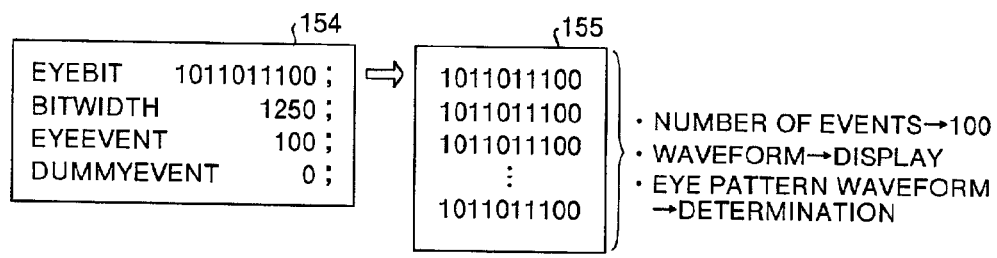
FIG. 17 is an illustration for explaining the case in which DUMMYEVENT=0 in FIG. 16A.

When a setting of DUMMYEVENT=0 is used in FIG. 16A, display and eye-pattern waveform determination of the random-pattern waveform and differential waveform corresponding to bit patterns of all repetitions including the first repetition are performed. FIG. 17 shows a setting example of a random-pattern generation command 154 in which DUMMYEVENT=0.

By the random-pattern generation command 154, a random-pattern 155 (random-pattern waveform and differential waveform) in which a bit pattern "1011011100" (EYEBIT) having a bit width (BITWIDTH) of one-thousand-two-hundred-and-fifty is repeated one-hundred times (EYEEVENT), is generated.

In the random-pattern 155, there is no dummy event, the random-pattern waveform and differential waveform corresponding to the random-pattern having a number of events of one hundred (one to hundred repetitions) are displayed on the display section 10 and eye-pattern determination is executed.

In the above-mentioned embodiment, an example, in which the waveform is frame-divided by one data width (UI_1, UI_2, . . . , UI_n) upon processing of frame-dividing of step SA12 (refer to FIG. 3) as shown in FIG. 12A, is described. The dividing origin in the frame-dividing is a cross-point of the negative waveform 70 and positive waveform 71.

Figure 20A:
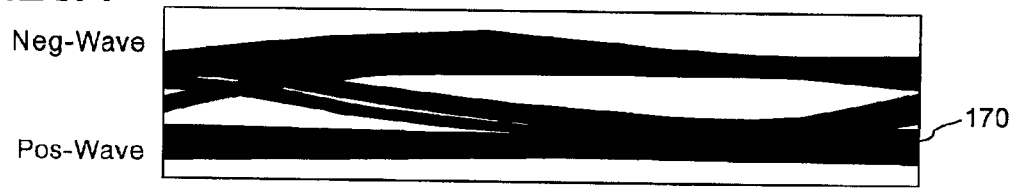
FIG. 20A and FIG. 20B are illustrations showing an eye-pattern waveform obtained when the random-pattern waveform shown in FIG. 5 is distorted.
Figure 20B:

When transmission line characteristics of the printed wiring 40 (transmission line) shown in FIG. 2 are debased, phase shifts and distortion in the random-pattern waveform and differential waveform may occur. Eye-pattern waveforms generated using the random-pattern waveform and differential waveform in which such phase shifts and distortion occur have their "eyes" shifted away from the center positions or chipped as shown in FIG. 20A and 20B. Therefore, in this case, good/bad determination of the eye-patterns cannot be performed.

The eye-pattern waveform 170 shown in FIG. 20A corresponds to the random-pattern waveform. The eye-pattern waveform 171 shown in FIG. 20B corresponds to the differential waveform.

When such a problem arises, as shown in FIG. 21 and FIG. 22, eye-pattern waveforms of which their good or bad can be determined are generated by frame-dividing the waveforms by a width that is wider than one data width UI.

Specifically, in step SA12 shown in FIG. 3, the eye-pattern analysis section 6 executes the processing of frame-dividing a random-pattern waveform, constituted of a positive waveform 180 and negative waveform 181, and a differential waveform 182, shown in FIG. 21, by a dividing width (F1, F2, . . . , Fn) that is twice the width of one data width.

For example, in the case of the dividing width F2, the eye-pattern analysis section 6 firstly shifts a dividing origin Pa (cross point of the positive waveform 180 and negative waveform 181) half of one data width UI/2 to the left to set a new dividing origin Pa' there. The dividing origin Pa is equivalent to the dividing origin of FIG. 12A.

Secondly, the eye-pattern analysis section 6 sets the dividing width F2 having a width that is twice the width of one data width UI from the new dividing origin Pa'. In this setting, adverse effects of phase shifts and distortion on the eye-pattern waveform are absorbed because the dividing width F2 is wider than one data width UI_2 that corresponds to one bit worth of random-pattern waveform and differential waveform 182. Other dividing widths F1, and F3–Fn can be set in the same manner as that of the dividing width F2 described above.

Figure 23A:
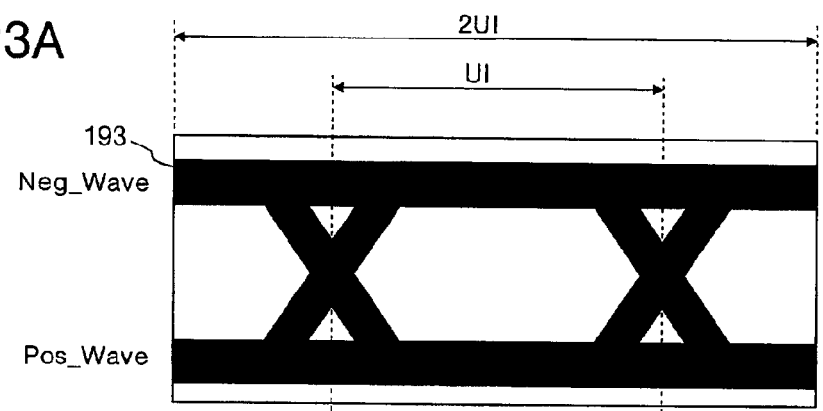
FIG. 23A and FIG. 23B are illustrations showing eye-pattern waveforms generated by the processing of frame-dividing in FIG. 21 and FIG. 22.
Figure 23B:
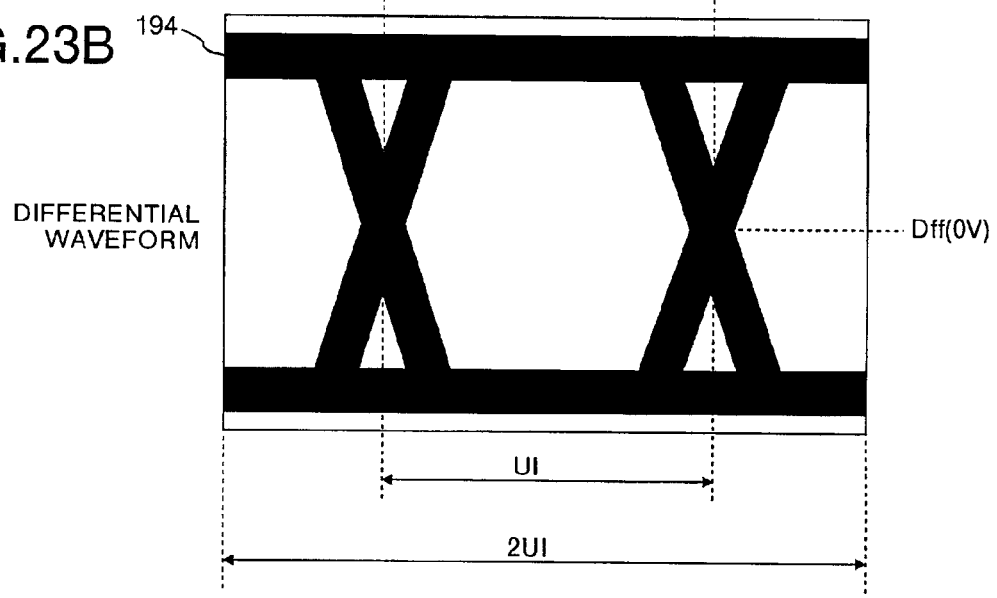

In step SA13, the eye-pattern analysis section 6 superimposes waveforms frame-divided respectively by the dividing width F1–Fn, and displays eye-pattern waveforms 193 and 194 shown in FIG. 23A and FIG. 23B, on the display section 10. The eye-pattern waveforms 193 and 194 shown in FIG. 23A and FIG. 23B have a width that is twice the width of one data width UI (2UI). The "eyes" corresponding to one-data-width UI portion of the width 2UI are clear and good or bad of the eye-patterns can then be determined for these waveforms. The good/bad determination of the eye-patterns is performed in accordance with the operations described above.

Left side section of a random-pattern waveform constituted of a negative waveform 190 and positive waveform 191 and left side section of a differential waveform 192, which are shown in FIG. 22, can be frame-divided in accordance with the above-described dividing method by the dividing width (F1, F2, . . . , Fn) that is twice the width of one data width, as shown in FIG. 22, in step SA12 shown in FIG. 3.

For example, in the case of the dividing width F6 shown in FIG. 22, the eye-pattern analysis section 6 firstly shifts a dividing origin Pb (cross-point of the negative waveform 190 and positive waveform 191) half of one data width UI/2 to the left to set a new dividing origin Pb'.

Secondly, the eye-pattern analysis section 6 sets the dividing width F6 having a width that is twice the width of one data width UI from the new dividing origin Pb'. In this setting, adverse effects of phase shifts and distortion on the eye-pattern waveforms are absorbed because the dividing width F6 is wider than one data width UI_6 that corresponds to one bit worth of the random-pattern waveform and differential waveform 192. Other dividing widths F1–F5, and Fn can be set in the same manner as that of the dividing width F6 described above.

In step SA13, the eye-pattern analysis section 6 superimposes waveforms frame-divided respectively by the dividing width F1–Fn, and displays eye-pattern waveforms 193 and 194 shown in FIG. 23A and FIG. 23B, on the display section 10. The eye-patterns in this case also have "eyes" that are clear and good or bad of the eye-patterns can then be determined for these waveforms. The good/bad determination of the eye-patterns is performed in accordance with the operations described above.

Figure 24:
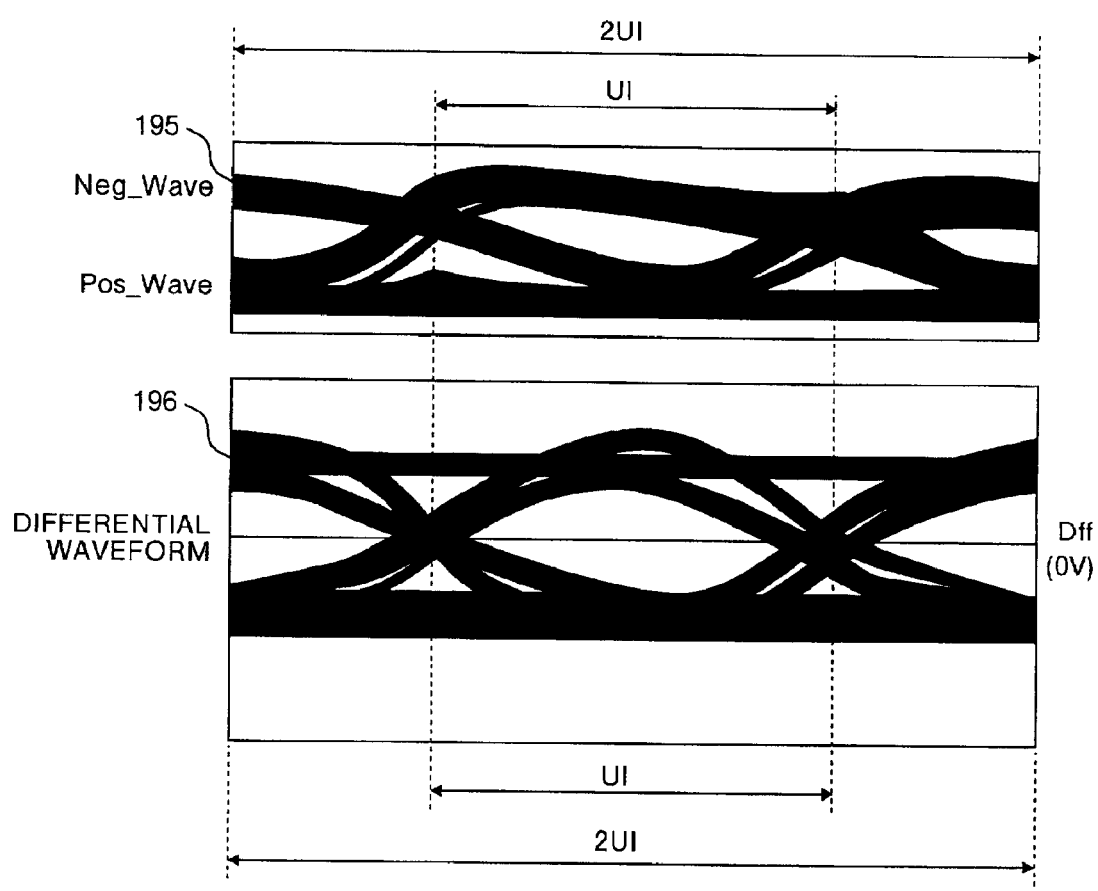
FIG. 24 is an illustration showing eye-pattern waveforms obtained by executing the processing of frame-dividing in FIG. 21 and FIG. 22 on the random-pattern waveform shown in FIG. 18A and FIG. 18B.

Eye-pattern waveforms 195 and 196 shown in FIG. 24 are generated when the processing of dividing according to FIG. 21 and FIG. 22 is executed for the random-pattern waveform and differential waveform 162 shown in FIG. 18A and FIG. 18B. The eye-pattern waveforms 195 and 196 in FIG. 24 also have a data width that is twice the width of one data width UI (2UI). The "eyes" corresponding to one-data-width UI portion of the width 2UI are clear and good or bad of the eye-patterns can then be determined for these waveforms.

Goodness or badness of the eye-pattern waveform corresponding to one of the random-pattern waveform and the differential waveform can be determined selectively.

As described above, according to the above-explained embodiment, a wiring model is generated in accordance with the parameter (design information) about a high-frequency circuit and a dummy random-pattern waveform for transmitting a wiring model and a differential waveform corresponding to the dummy random-pattern waveform are generated to skew the random-pattern waveform or differential waveform in accordance with a preset skew width (Skew_MAX). Therefore, it is possible to easily perform the random-pattern analysis and skew analysis of high-frequency differential waveforms or ordinary signal waveforms.

Moreover, jitter is caused in a random-pattern waveform in accordance with a preset jitter addition value (JV) and an eye-pattern waveform is generated by superimposing frame-divided random-pattern waveforms or differential waveforms. Therefore, it is possible to easily perform the jitter analysis and eye-pattern analysis of high-frequency differential waveforms or ordinary signal waveforms.

Furthermore, good/bad determination of a differential waveform or eye-pattern waveform is performed in accordance with a preset reference value as described in steps SA10 and SA14. Therefore, it is possible to immediately return a good/bad determination result to high-frequency circuit design.

Moreover, a signal-analysis simulation model is generated in accordance with high-frequency-circuit design information; a dummy random-pattern waveform for transmitting the signal-analysis simulation model and a differential waveform corresponding to the dummy random-pattern waveform are generated in accordance with a command including the bit information of a random-pattern waveform; and region to be excluded (for example, a region that would have adverse effects on the analysis) from a range to be analyzed when analyzing the random-pattern waveform or differential waveform, is set in the DUMMYEVENT shown in FIG. 16C. As a result, accuracy of the analysis can be increased.

Furthermore, good or bad of an eye-pattern waveform corresponding to the random-pattern waveform or differential waveform in accordance with a preset reference value, over the range excluding the region (for example, the region of which good or bad of the eye-pattern can be determined) set in DUMMYEVENT, is determined. Thus, accuracy of the good/bad determination of the eye-pattern can be increased.

Moreover, as already explained in reference to FIG. 21 and FIG. 22, an eye-pattern waveform is generated by superimposing waveforms obtained by frame-dividing the random-pattern waveform or differential waveform by a division width that includes one bit worth of waveform and is of one data width UI or wider (twice the width of one data width UI). Therefore, effects of phase shifts and distortion are decreased, the eye-pattern waveform of which good or bad can be determined is generated and accuracy of the good/bad determination can be increased.

An embodiment of the present invention is described above by referring to the accompanying drawings. However, a specific configuration is not restricted to the embodiment. Design modifications are also included in the present invention as long as they are not deviated from the gist of the present invention. For example, in the case of the above embodiment, it is also permitted to realize functions of the signal-waveform simulation apparatus shown in FIG. 1 by recording a signal-waveform simulation program for realizing functions of the signal-waveform simulation apparatus in the computer-readable recording medium 300 shown in FIG. 25 and making the computer 200 shown in FIG. 25 read and execute the signal-waveform simulation program recorded in the recording medium 300.

Figure 25:
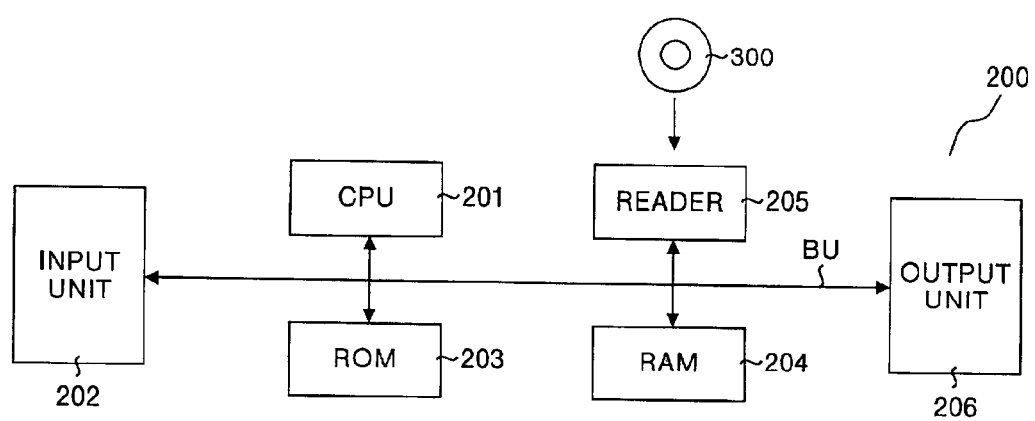
FIG. 25 is a block diagram showing a modification of the embodiment in FIG. 1.
Figures 26A, 26B:
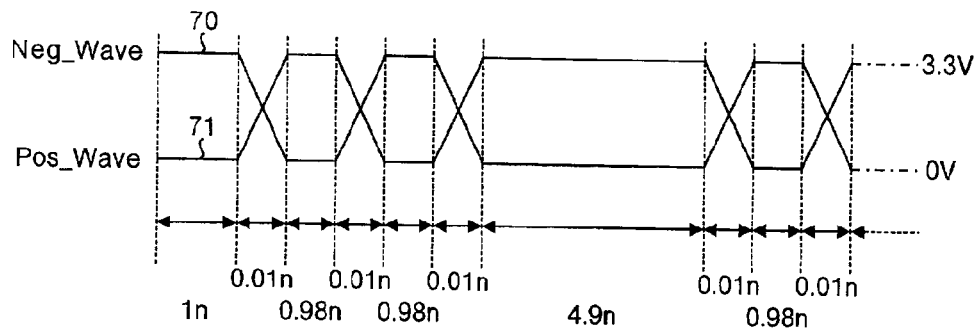
FIG. 26A and FIG. 26B are illustrations for explaining a conventional random-pattern waveform generation method.

The computer 200 shown in FIG. 25 is constituted of a CPU 201 for executing the above signal-waveform simulation program, an input unit 202 including a keyboard and a mouse, a ROM (Read Only Memory) 203 for storing various data values, a RAM (Random Access Memory) 204 for storing operation parameters, a reader 205 for reading a signal-waveform simulation program from a recording medium 300, an output unit 206 including a display and a printer, and a bus BU for connecting various sections of the apparatus.

The CPU 201 realizes functions of the above signal-waveform simulation apparatus by reading a signal-waveform simulation program from the recording medium 300 via the reader 205 and then executing the signal-waveform simulation program. The recording medium 300 includes not only a portable recording media such as an optical disk, a floppy disk, and a hard disk but also a transmission medium for temporarily storing data like a network.

Moreover, the embodiment explained about differential waveform. However, ordinary signal waveform may also be used.

As described above, according to the present invention, it is possible to easily perform the random-pattern analysis and skew analysis of high-frequency differential waveforms or ordinary signal waveforms.

Moreover, it is possible to immediately return a good/bad determination result to high-frequency circuit design.

Furthermore, it is possible to increase the accuracy of the waveform analysis.

In addition, it is possible to increase the accuracy of the good/bad determination of the eye-patterns.

What is more, it is also possible to decrease the effects of phase shifts and distortion and to obtain eye-patterns of which their good or bad can be determined.

Moreover, the good/bad determination can be performed with eye-patterns having little effects of phase shifts and distortion and the accuracy of the good/bad determination can be increased.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for signal-waveform simulation, comprising:
   a model generation unit which generates a signal-analysis simulation model in accordance with high-frequency-circuit design information;
   a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform;
   a skew analysis unit which skews the random-pattern waveform or the differential waveform in accordance with a preset skew width;

an eye-pattern analysis unit which generates an eye-pattern waveform by superimposing waveforms obtained by frame-dividing the random-pattern waveform or the differential waveform; and a determination unit which determines qualities of the eye-pattern waveform in accordance with a reference eye pattern and based on an area of an eye, wherein when it is determined that an eye portion of the eye-pattern waveform enters the reference eye pattern, the determination unit displays waveforms corresponding to an error bit and a plurality of bits before and after the error bit associated with the eye-pattern waveform.

2. The apparatus according to claim 1, further comprising:

a jitter analysis unit which generates jitter in the random-pattern waveform in accordance with a preset jitter addition value.

3. A method of signal-waveform simulation, comprising the steps of:

generating a signal-analysis simulation model in accordance with high-frequency-circuit design information;

generating a dummy random-pattern waveform for transmitting the signal-analysis simulation model and a differential waveform corresponding to the dummy random-pattern waveform in accordance with a command including the bit information of a random-pattern waveform and analyzing them; and skewing the random-pattern waveform or the differential waveform in accordance with a preset skew width;

generating an eye-pattern waveform by superimposing waveforms obtained by frame-dividing the random-pattern waveform or the differential waveform;

determining qualities of the eye-pattern waveform in accordance with a reference eye pattern and based on an area of an eye; and displaying waveforms corresponding to an error bit and a plurality of bits before and after the error bit associated with the eye-pattern waveform when it is determined that an eye portion of the eye-pattern waveform enters the reference eye pattern.

4. A computer readable medium for storing instructions, which when executed on a computer, causes the computer to perform a method comprising:

generating a signal-analysis simulation model in accordance with high-frequency-circuit design information;

generating a dummy random-pattern waveform for transmitting the signal-analysis simulation model and a differential waveform corresponding to the dummy random-pattern waveform in accordance with a command including the bit information of a random-pattern waveform and analyzing them;

skewing the random-pattern waveform or the differential waveform in accordance with a preset skew width;

generating an eye-pattern waveform by superimposing waveforms obtained by frame-dividing the random-pattern waveform or the differential waveform;

determining qualities of the eye-pattern waveform in accordance with a reference eye pattern and based on an area of an eye; and displaying waveforms corresponding to an error bit and a plurality of bits before and after the error bit associated with the eye-pattern waveform when it is determined that an eye portion of the eye-pattern waveform enters the reference eye pattern.

5. An apparatus for signal-waveform simulation, comprising:

a model generation unit which generates a signal-analysis simulation model in accordance with high-frequency-circuit design information;

a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform;

a setting unit which sets a region to be excluded from a range to be analyzed in the random-pattern waveform or the differential waveform;

an eye-pattern analysis unit which generates an eye-pattern waveform by superimposing waveforms obtained by frame-dividing the random-pattern waveform or the differential waveform; and a determination unit which determines qualities of the eye-pattern waveform in accordance with a reference eye pattern and based on an area of an eye, wherein when it is determined that an eye portion of the eye-pattern waveform enters the reference eye pattern, the determination unit displays waveforms corresponding to an error bit and a plurality of bits before and after the error bit associated with the eye-pattern waveform.

6. An apparatus for signal-waveform simulation, comprising:

a model generation unit which generates a signal-analysis simulation model in accordance with high-frequency-circuit design information;

a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform;

an eye-pattern analysis unit which generates an eye-pattern waveform by superimposing waveforms obtained by frame-dividing the random-pattern waveform or the differential waveform by a division width that includes a waveform of one bit and is of one data width or wider;

a determination unit which determines qualities of the eye-pattern waveform in accordance with a reference eye pattern and based on an area of an eye, wherein when it is determined that an eye portion of the eye-pattern waveform enters the reference eye pattern, the determination unit displays waveforms corresponding to an error bit and a plurality of bits before and after the error bit associated with the eye-pattern waveform.

7. A computer program containing instructions which when executed on a computer causes the computer to realize the units of:

a model generation unit which generates a signal-analysis simulation model in accordance with high-frequency-circuit design information;

a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform;

a skew analysis unit which skews the random-pattern waveform or the differential waveform in accordance with a preset skew width;

an eye-pattern analysis unit which generates an eye-pattern waveform by superimposing waveforms obtained by frame-dividing the random-pattern waveform or the differential waveform; and a determination unit which determines qualities of the eye-pattern waveform in accordance with a reference eye pattern and based on an area of an eye, wherein when it is determined that an eye portion of the eye-pattern waveform enters the reference eye pattern, the determination unit displays waveforms corresponding to an error bit and a plurality of bits before and after the error bit associated with the eye-pattern waveform.

8. A computer program containing instructions which when executed on a computer causes the computer to realize the units of:

a model generation unit which generates a signal-analysis simulation model in accordance with high-frequency-circuit design information;

a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform;

a setting unit which sets a region to be excluded from a range to be analyzed in the random-pattern waveform or the differential waveform;

an eye-pattern analysis unit which generates an eye-pattern waveform by superimposing waveforms obtained by frame-dividing the random-pattern waveform or the differential waveform; and a determination unit which determines qualities of the eye-pattern waveform in accordance with a reference eye pattern and based on an area of an eye, wherein when it is determined that an eye portion of the eye-pattern waveform enters the reference eye pattern, the determination unit displays waveforms corresponding to an error bit and a plurality of bits before and after the error bit associated with the eye-pattern waveform.

9. A computer program containing instructions which when executed on a computer causes the computer to realize the units of:

a model generation unit which generates a signal-analysis simulation model in accordance with high-frequency-circuit design information;

a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform;

a setting unit which sets a region to be excluded from a range to be analyzed in the random-pattern waveform or the differential waveform;

an eye-pattern analysis unit which generates an eye-pattern waveform by superimposing waveforms obtained by frame-dividing the random-pattern waveform or the differential waveform by a division width that includes a waveform of one bit and is of one data width or wider;

an eye-pattern analysis unit which generates an eye-pattern waveform by superimposing waveforms obtained by frame-dividing the random-pattern waveform or the differential waveform; and a determination unit which determines qualities of the eye-pattern waveform in accordance with a reference eye pattern and based on an area of an eye, wherein when it is determined that an eye portion of the eye-pattern waveform enters the reference eye pattern, the determination unit displays waveforms corresponding to an error bit and a plurality of bits before and after the error bit associated with the eye-pattern waveform.

10. An apparatus, comprising:

a model generation unit which generates a signal-analysis simulation model in accordance with high-frequency-circuit design information;

a random-pattern analysis unit which generates and analyzes a dummy random-pattern waveform for transmitting the signal-analysis simulation model and a differential waveform corresponding to the dummy random-pattern waveform in accordance with a command including the bit information of a random-pattern waveform;

a skew analysis unit which skews the random-pattern waveform or the differential waveform in accordance with a preset skew width;

an eye-pattern analysis unit which generates an eye-pattern waveform by superimposing waveforms obtained by frame-dividing the random-pattern waveform or the differential waveform; and means for determining qualities of the eye-pattern waveform in accordance with a reference eye pattern and based on an area of an eye, wherein when it is determined that an eye portion of the eye-pattern waveform enters the reference eye pattern, waveforms are displayed corresponding to an error bit and a plurality of bits before and after the error bit associated with the eye-pattern waveform.

\* \* \* \* \*